United States Patent [19]
Sushihara et al.

[11] Patent Number: 5,627,490
[45] Date of Patent: May 6, 1997

[54] AMPLIFIER CIRCUIT

[75] Inventors: Koji Sushihara; Takashi Yamamoto, both of Iizuka; Ikuo Imanishi, Nagaokakyo; Tsuyoshi Nakamura, Iizuka; Michinori Kishimoto, Iizuka; Kenichi Ishida, Iizuka, all of Japan

[73] Assignee: Matsushita Electric Industrial Co., Ltd., Osaka, Japan

[21] Appl. No.: 597,258

[22] Filed: Feb. 6, 1996

[30] Foreign Application Priority Data

Feb. 23, 1995 [JP] Japan .................................. 7-034878

[51] Int. Cl.$^6$ .................................................. H03K 3/45
[52] U.S. Cl. ........................... 327/510; 327/509; 327/530
[58] Field of Search ........................ 323/315; 327/510, 327/511, 512, 516, 517, 187, 378, 103, 530-533, 538-547, 509

[56] References Cited

U.S. PATENT DOCUMENTS

| | | | |
|---|---|---|---|
| 4,495,425 | 1/1985 | McKenzie | 323/315 |
| 5,175,489 | 12/1992 | Mizuide | 323/315 |
| 5,440,224 | 8/1995 | Kimura | 323/315 |
| 5,444,363 | 8/1995 | Cabler | 323/315 |
| 5,448,159 | 9/1995 | Kojima et al. | 323/315 |
| 5,543,746 | 8/1996 | Kuo | 327/543 |

FOREIGN PATENT DOCUMENTS 6-139525  5/1994  United Kingdom .

*Primary Examiner*—Toan Tran
*Attorney, Agent, or Firm*—McDermott, Will & Emery

[57]  ABSTRACT

An amplifier circuit for amplifying a change in a resistance value of a magnetic resistance element is formed by connecting a first and a second current mirror circuits having the same structure in cascode, so that a voltage change is amplified without using a capacitive coupling. Hence, a high-pass filter is not created as a parasitic circuit, whereby a gain is maintained high in the low frequency region and a low frequency characteristic is excellent. Further, since control electrodes of transistors which form each current mirror circuit are grounded through the capacitance, a noise is reduced without using a conventional feedback circuit. This eliminates an influence of the feedback circuit over a high frequency characteristic, and therefore, a high frequency characteristic becomes excellent.

19 Claims, 24 Drawing Sheets

Fig.12

| HS0 | HS1 | H0 | H1 | H2 | H3 |
|-----|-----|----|----|----|----|
| L | L | H | L | L | L |
| H | L | L | H | L | L |
| L | H | L | L | H | L |
| H | H | L | L | L | H |

AMPLIFIER CIRCUIT

BACKGROUND OF THE INVENTION

The present invention relates to an improvement in an amplifier circuit, and more particularly, to an improvement in a high frequency characteristic.

FIG. 24 shows a conventional amplifier circuit. In FIG. 24, denoted at 70 is a current supply part, denoted at SW1, SW2 ... SWn are switch circuits, and denoted at R1, R2 ... Rn are magnetic resistance elements whose resistance values change due to an external factor. The magnetic resistance elements R1 to Rn correspond to said switch circuits SW1 to SWn, respectively. Denoted at 71 is a capacitance, denoted at 72 is a feedback circuit, denoted at 73 is an amplifier, and denoted at 74 is an output terminal of the amplifier circuit. By shorting one of the plurality of the switch circuits SW1, SW2 ... SWn (e.g., SW1), the magnetic resistance element R1 which corresponds to the shorted switch circuit is selected. At this stage, a current is supplied to said selected magnetic resistance element R1 from the current supply part 70 through said selected switch circuit SW1. If the resistance value of the selected magnetic resistance element R1 changes due to an external factor, a voltage which is developed across the magnetic resistance element R1 changes, and this voltage change is supplied to the amplifier 73 through the capacitance 71. The voltage change thus supplied is amplified by the amplifier 73, and an amplified voltage is outputted at the output terminal 74.

However, said conventional amplifier circuit has the following disadvantages.

That is, since a signal which expresses the voltage change at the selected magnetic resistance element is coupled with the amplifier 73 by the capacitance 71, the capacitance 71 and an input impedance of the amplifier 73 create a high-pass filter, and this filter reduces a gain in a low region and hence a low region frequency characteristic.

Further, while the feedback circuit 72 reduces a noise which is included in an output from the amplifier 73, because of a delay created by the feedback circuit 72, the output oscillates easily in a high frequency region, and thus, the output is not enough large to deal with oscillation in the high frequency region. Hence, it is impossible to maintain a high gain in a higher frequency region.

Still further, since the switch circuits SW1 to SWn are connected to the magnetic resistance elements R1 to Rn in series, when the resistance value of a selected magnetic resistance element changes, a resistance component and an inductance component of the shorted switch circuit causes a voltage across the shorted switch circuit to change. This voltage change is combined with the change in the voltage across the magnetic resistance element and supplied to the amplifier 73. As a result, an output from the amplifier 73 includes an error. Thus, amplification performed by the amplifier 73 is influenced by the switch circuit.

SUMMARY OF THE INVENTION

Accordingly, a first object of the present invention is to provide for an amplifier circuit which has a high gain both in a low frequency region and a high frequency region. A second object of the present invention is to provide for an amplifier circuit which is not influenced by switch circuits.

To achieve said first object, the present invention adopts a structure which amplifies a voltage change, without using a capacitive coupling and a feedback circuit. To achieve said second object, the present invention adopts a structure in which switch circuits for selecting resistance elements are not connected in series to associated resistance elements, but the resistance elements can be selected.

To achieve the objects above, an amplifier circuit according to the present invention comprises: a first current mirror circuit and a second current mirror circuit; a first resistor; a resistor member whose resistance value changes due to an external factor; a current supply circuit; and a second resistor, wherein said first and said second current mirror circuits have the same structure, said first and said second current mirror circuits each comprise: a first input terminal and a first output terminal; a first transistor which is disposed between the first input terminal and the first output terminal, said first transistor having a control electrode connected to said first input terminal; a second input terminal and a second output terminal; and a second transistor which is disposed between the second input terminal and the second output terminal, said second transistor having a control electrode connected to said first input terminal, said control electrodes of said first and said second transistors are connected to a set potential through a capacitance, the first and the second input terminals of said first current mirror circuit are connected to the first and the second output terminals of said second current mirror circuit, respectively, said first resistor is disposed between the first output terminal of said first current mirror circuit and a set constant potential, said resistor member is disposed between the second output terminal of said first current mirror circuit and said set constant potential, said current supply circuit is connected to the first input terminal of said second current mirror circuit, said second resistor is disposed between a power source and the second input terminal of said second current mirror circuit, and a change in the resistance value of said resistor member is outputted as a change in a voltage which is developed across said second resistor.

A further amplifier circuit according to the present invention comprises: a plurality of input blocks each consisting of a first current mirror circuit, a first resistor, a resistor member whose resistance value changes due to an external factor; a selector circuit for selecting one of said plurality of input blocks; a second current mirror circuit; a current supply circuit; and a second resistor, wherein said first and said second current mirror circuits have the same structure, said first and said second current mirror circuits each comprises: a first input terminal and a first output terminal; a first transistor which is disposed between the first input terminal and the first output terminal, said first transistor having a control electrode connected to said first input terminal; a second input terminal and a second output terminal; and a second transistor which is disposed between the second input terminal and the second output terminal, said second transistor having a control electrode connected to said first terminal, said control electrodes of said first and said second transistors are connected to a set potential through a capacitance, in each one of said input blocks, the first and the second input terminals of said first current mirror circuit are connected to the first and the second input terminals of said second current mirror circuit, respectively, said first resistor is disposed between the first output terminal of said first current mirror circuit and a set constant potential, said resistor member is disposed between the second output terminal of said first current mirror circuit and said set constant potential, said current supply circuit is connected to the first input terminal of said second current mirror circuit, said second resistor is disposed between a power source and the second input terminal of said second current mirror circuit, and a change in the resistance value of said resistor member which belongs to one of the input blocks which is selected by said selector circuit is outputted as a change in a voltage which is developed across said second resistor.

Further, according to the present invention, in said amplifier circuit, the selector circuit is formed by a select signal output circuit for outputting a select signal which selects one of the input block and a selection control circuit which is disposed in each one of the input block, said selection control circuit is formed by: a first switch circuit for shorting and opening the control electrode and the electrode which is connected to said first input terminal of the first transistor of an associated one of the input blocks; a second switch circuit for shorting and opening the control electrodes of said first and said second transistors and the set constant potential; and a switch control circuit for shorting said first switch circuit but opening said second switch circuit in response to the select signal from said select signal output circuit, said switch control circuit opening said first switch circuit but shorting said second switch circuit when the select signal is not received from said select signal output circuit.

In addition, according to the present invention, in said amplifier circuit, a stop control circuit outputs a stop control signal to the current supply circuit so as to stop supply of a current from the current supply circuit, and when the stop control signal is outputted from said stop control circuit, in response to the stop control signal, the select signal output circuit does not output the select signal to any one of the switch control circuits so as not to select any one of the input blocks.

Constructed as described above, in the amplifier circuits according to the present invention, the second resistor (i.e., load resistance), the transistor which forms the second current mirror circuit, the transistor which forms the first current mirror circuit, and the resistor member or the third resistance are connected in a direct-current structure in this order. Hence, when the resistance value of the second resistor is set larger than the resistance value of said resistor member or the third resistance value, a change in a voltage which is developed across said resistor member or the third resistance is amplified as a change in a voltage which is developed across said second resistor. Since the voltage change is amplified without using a capacitive coupling, a high-pass filter is not created, and therefore, a gain is maintained high in a low frequency region and a low frequency characteristic is improved. Further, since the control electrodes of the first and the second transistors which form each current mirror circuit are grounded in an alternate current manner through the capacitance, potentials at the both control electrodes become a stable and constant value, which in turn makes it possible to reduce a noise without using a feedback circuit unlike in a conventional structure. This eliminates an influence of a conventional feedback circuit over a high frequency characteristic, and therefore, a gain in a high frequency region as well is maintained high and the high frequency characteristic is improved.

Further, in the amplifier circuits according to the present invention, when one of the plurality of the resistor members is selected, in the input block which includes the resistor member to be selected, the first switch circuit is shorted and the second switch circuit is opened in this input block, and therefore, the first current mirror circuit which belongs to this input block functions as a current mirror, whereby a current is supplied to the resistor member which belongs to this input block. Since said first and said second switch circuits are not connected in series to the resistor member to be selected, a change in a voltage which is developed across the selected resistor member is amplified as a change in a voltage which is developed across said second resistor (i.e., load resistance), without influenced by shorting or opening of these switch circuits.

Still further, in the amplifier circuits according to the present invention, since the second switch circuit of each selection control circuit is shorted to ground the control electrode of the second transistor which forms the first current mirror circuit of each input block when supply of a current from the current supply circuit is stopped, a current is prevented from flowing into the resistor member from the control electrode through the second transistor.

These objects above and novel features of the present invention will become more completely apparent from the following detailed description of the present invention when taken in conjunction with the accompanying drawings.

BRIEF DESCRIPTION OF THE DRAWINGS

Of the accompanying drawings showing preferred embodiments of the present invention.

FIG. 12 is a view showing a table of truth value for the multiplexer within the amplifier circuit according to the fourth preferred embodiment of the present invention;

DESCRIPTION OF THE PREFERRED EMBODIMENTS

In the following, each one of preferred embodiments of the present invention will be described along the accompanying drawings.

Now, preferred embodiments of the present invention will be described with reference to the associated drawings.

First Preferred Embodiment

Figure 1:
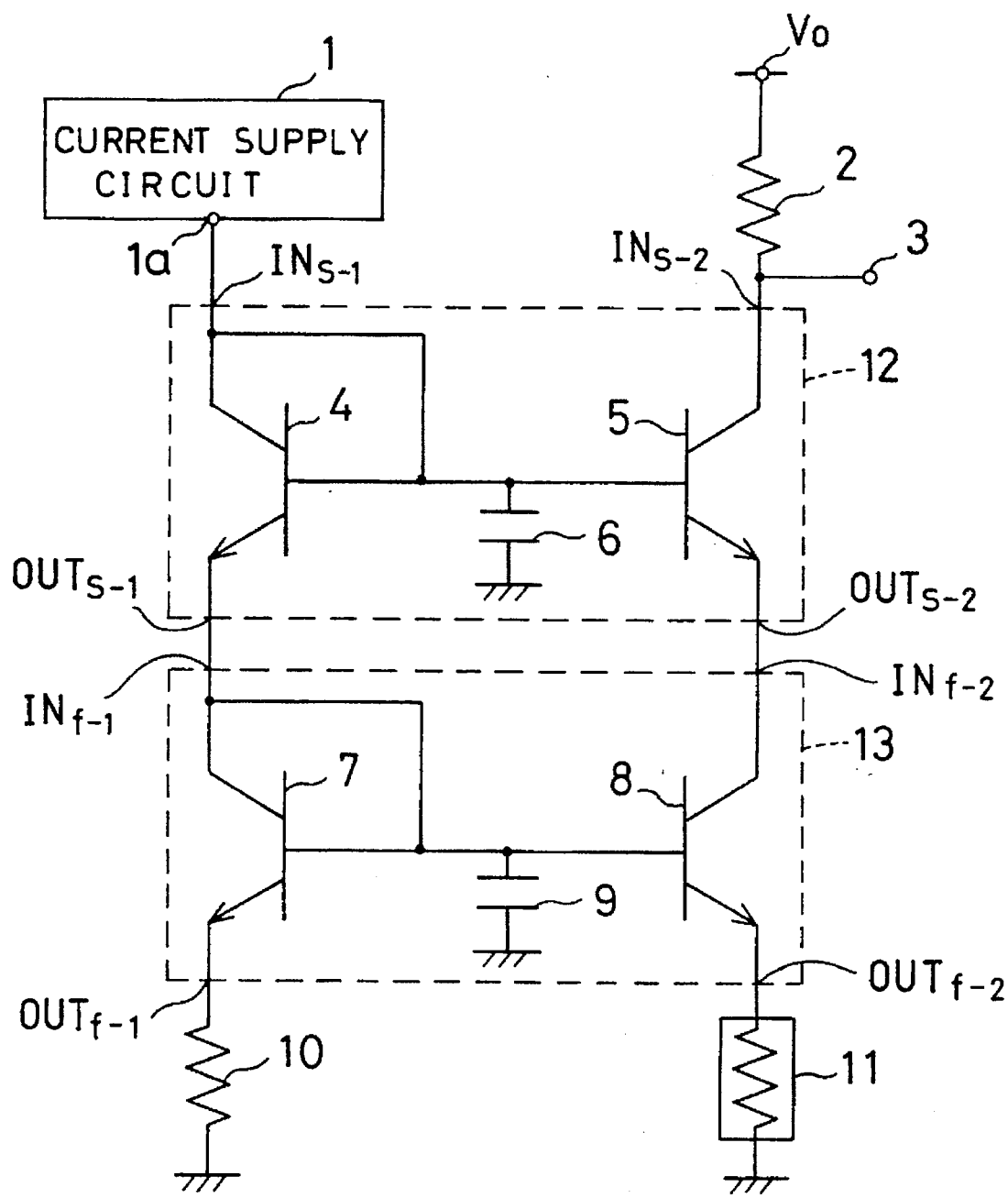
FIG. 1 is a view showing an amplifier circuit according to a first and an eleventh preferred embodiments of the present invention.

FIG. 1 shows an amplifier circuit according to a first preferred embodiment of the present invention. In FIG. 1, denoted at 1 is a current supply circuit, denoted at 10 is a first resistor, denoted at 2 is a second resistor, denoted at 3 is an output terminal of the amplifier circuit, denoted at 13 is a first current mirror circuit, denoted at 12 is a second current mirror circuit, and denoted at 11 is a resistor member, e.g., a magnetic resistor element whose resistance value changes due to an external factor.

Said current mirror circuits 12 and 13 have the same structure. Said first current mirror circuit 12 comprises a first transistor 7 and a second transistor 8, and a capacitance 9. Said second current mirror circuit 13 comprises a first transistor 4 and a second transistor 5, and a capacitance 6. In the following, a structure of the first current mirror circuit 12 will be described. Having the same structure, the second current mirror circuit 13 will not be described.

In the first current mirror circuit 12, the first transistor 7 has a collector and a base connected in the form of a diode. Bases (control electrodes) of the first transistor 7 and the second transistor 8 are connected to each other. The both bases are connected to a set constant potential (ground potential in this embodiment) through the capacitance 6, to be grounded in an alternate current manner. An emitter of said transistor 7 serves as a first input terminal $IN_{f-1}$, the collector of said transistor 7 serves as a first output terminal $OUT_{f-1}$, an emitter of said transistor 8 serves as a second input terminal $IN_{f-2}$, the collector of said transistor 8 serves as a second output terminal $OUT_{f-2}$. In a similar manner, in the second current mirror circuit 13, an emitter of the transistor 4 serves as a first input terminal $IN_{s-1}$, the collector of the transistor 4 serves as a first output terminal $OUT_{s-1}$, an emitter of the transistor 5 serves as a second input terminal $IN_{s-2}$, the collector of the transistor 5 serves as a second output terminal $OUT_{s-2}$.

Said first and said second current mirror circuits 12 and 13 are connected in cascode. In other words, the first and the second input terminals $IN_{f-1}$ and $IN_{f-2}$ of the first current mirror circuit 12 are connected to the first and the second output terminals $OUT_{s-1}$ and $OUT_{s-2}$ of the second current mirror circuit 13, respectively.

In said current mirror circuit 13, one end of the first resistor 10 is connected to the first output terminal $OUT_{f-1}$ and one end of the resistor member 11 is connected to the second output terminal $OUT_{f-2}$. The other ends of the first resistor 10 and the resistor member 11 are grounded at the set constant potential (zero potential).

Further, in the second current mirror circuit 13, the first input terminal $IN_{s-1}$ is connected to an output terminal $1a$ of the current supply circuit 1 and the second input terminal $IN_{s-2}$ is connected to one end of the second resistor 2. The other end of said second resistor 2 is connected to a power source Vo. An output terminal 3 of the amplifier circuit is led outside between the second input terminal $IN_{s-2}$ and the one end of the second resistor 2.

If a ratio in terms of size between the two transistors 7 and 8 of the first current mirror circuit 13 and a ratio in terms of size between the two transistors 4 and 5 of the second current mirror circuit 12 are each a set value n (n is a mirror ratio), a ratio of the resistance value of the first resistor 10 to the resistance value of the magnetic resistor member 11 is an inverse number (1/N) of the mirror ratio n, and therefore, the magnetic resistance element 11 is provided with a current which is obtained by multiplying a current flowing in the first resistor 10 by the mirror ratio of n.

The second resistor 2 is set to have a resistance value which is larger than the resistance value of the magnetic resistor member 11.

Next, an operation of the amplifier circuit will be described.

An operation where there is no external factor to the magnetic resistance element 11 is as follows. That is, when a current is supplied from the output terminal $1a$ of the current supply circuit 1, the current flows in the first resistor 10 through the first and the second current mirror circuits 12 and 13, whereby a current which is obtained by multiplying the current value n times of the mirror ratio flows in the magnetic resistance element 11.

When the resistance value of the magnetic resistance element 11 changes due to an external factor after this, and the value of the voltage which is applied across the magnetic resistance element 11 and the value of the current which flows in the magnetic resistance element 11 change, and accordingly, the value of a current which flows in the second resistor 2 changes. In the second resistor 2, a voltage which is developed across the second resistor 2 changes by a voltage value which is determined by the resistance value of the second resistor 2 and the change in the current which flows in the second resistor 2. Since the resistance value of the second resistor 2 is larger than the resistance value of the magnetic resistor member 11, the change in the resistance value of the magnetic resistance element 11 is amplified as a change in the voltage which is developed across said second resistor 2 and outputted outside at the output terminal 3.

Figure 24:
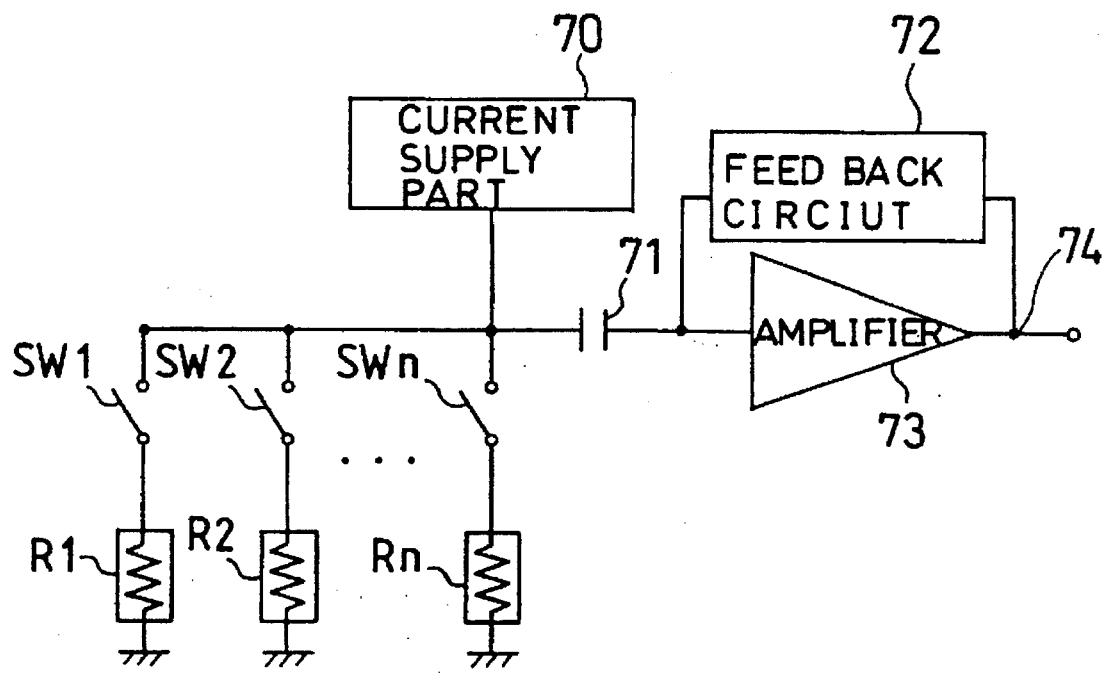
FIG. 24 is a view showing a conventional amplifier circuit.

Thus, in the present embodiment, since the first and the second current mirror circuits 12 and 13 respectively having the capacitances 6 and 9 are connected in cascode, a gain is maintained high both in a low frequency region and a high frequency region and frequency characteristics are improved, while reducing a noise. That is, in the circuit which is shown in FIG. 1, when the resistance value of the second resistor 2 is set at a higher value than the resistance value of the magnetic resistance element 11, it is possible to amplify a voltage change in the magnetic resistance element 11 into a voltage change in the second resistor 2 and to output the same at the output terminal 3, without using a capacitive coupling realized by the capacitance 71 of FIG. 24 which shows the conventional example. Hence, a high-pass filter is not created unlike in the conventional example, and therefore, a gain is maintained high in a low frequency region and a low frequency characteristic is excellent. In addition, since bases of the first and the second current mirrors 13 and 12 are grounded in an alternate current manner through the capacitances 9 and 6, respectively, a noise is reduced without using the feedback circuit 72 which is shown in FIG. 24 which illustrates the conventional example. This eliminates an influence of the feedback circuit 72 over a high frequency characteristic, and therefore, a gain in a high frequency region as well is maintained high so that the high frequency characteristic becomes excellent.

Figure 6:
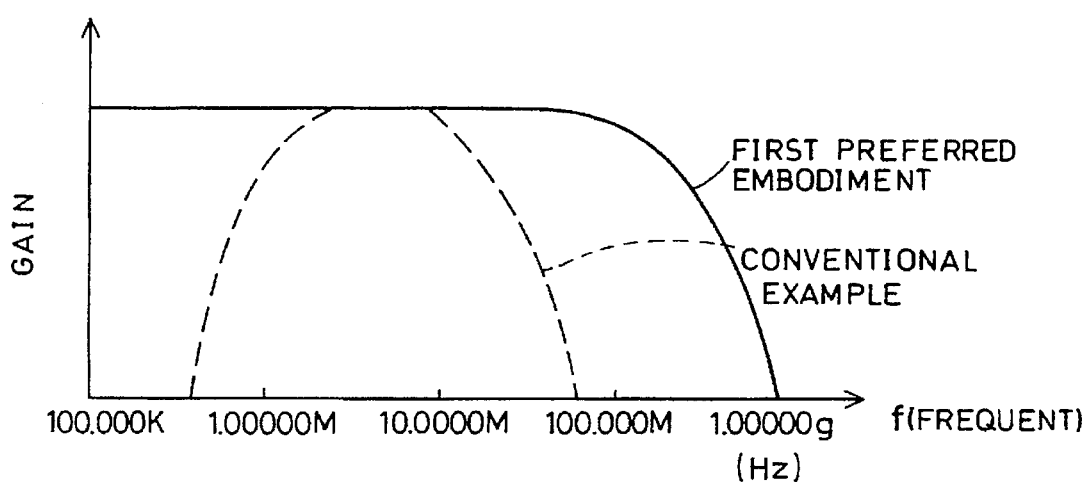
FIG. 6 is a view showing a frequency characteristic of the amplifier circuit according to the first preferred embodiment of the present invention, as it is compared with that of a conventional amplifier circuit.

FIG. 6 shows comparison of the frequency characteristics according to the present embodiment and the frequency characteristics according to the conventional example. In FIG. 6, a frequency (Hz) is measured along a horizontal axis and decibel (dB) is measured along a vertical axis. A frequency characteristic curve of the present embodiment is shown with the solid line, while a frequency characteristics curve of the conventional example of FIG. 24 is shown with the dotted line. As can be understood from FIG. 6, as compared with the Frequency characteristic curve of the conventional amplifier circuit, the frequency characteristic curve of the amplifier circuit according to the present embodiment exhibits that a gain remains high in both the low frequency region and the high frequency region and that the frequency characteristics are excellent.

In addition, in the present embodiment, since the capacitances 6 and 9 are formed in the first and the second current mirror circuits 12 and 13, respectively, and since the bases of the transistors 4, 5 and the bases of the transistors 7, 8 are grounded in an alternate current manner, it is possible to reduce a noise.

Figure 4:
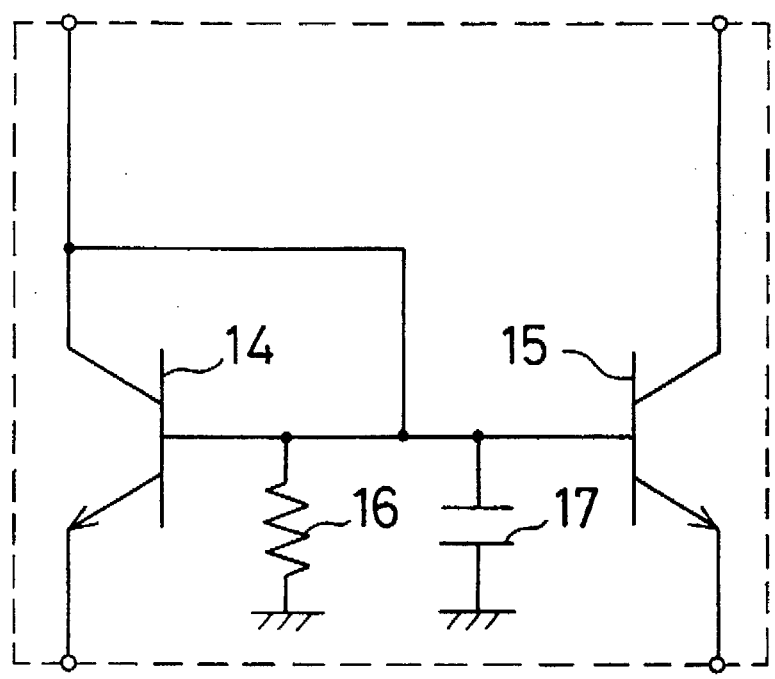
FIG. 4 is a view showing a modified current mirror circuit.
Figure 5:
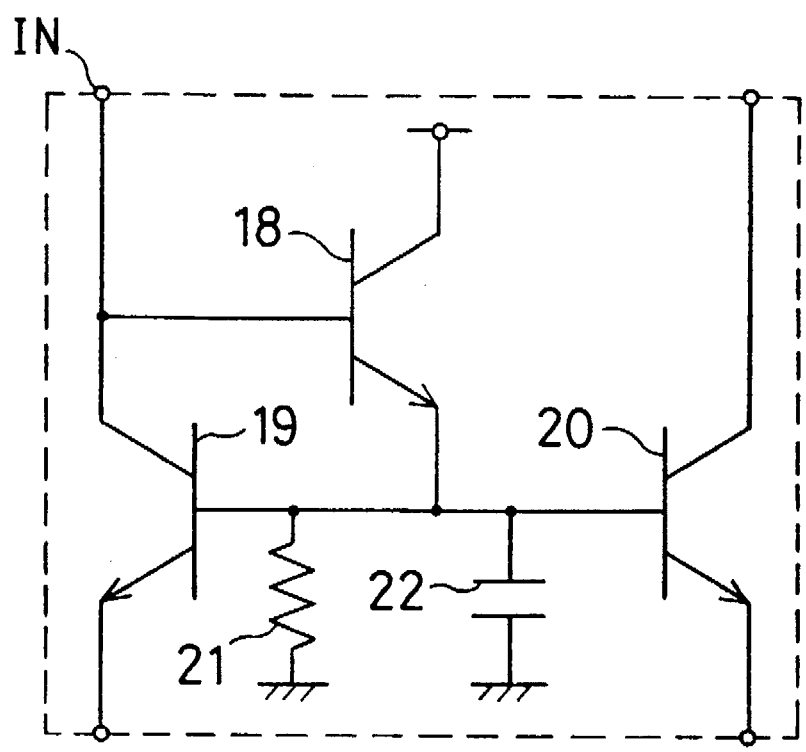
FIG. 5 is a view showing another modified current mirror circuit.

The present embodiment may be modified to form the current mirror circuits 12 and 13 by current mirror circuits as those shown in FIGS. 4 and 5. The current mirror circuit shown in FIG. 4 is a circuit which comprises a resistor 16 for discharging and adjustment of the frequency characteristics, in addition to two transistors 14 and 15 and a capacitance 17 which is disposed between the bases of these transistors and a minimum potential (ground potential). In addition to two transistors 19 and 20 and a capacitance 22 which is disposed between the bases of these transistors and a minimum potential (ground potential), the current mirror circuit shown in FIG. 5, i.e., a 3-transistor type current mirror circuit comprises a resistor 21 for discharging and adjustment of the frequency characteristics, and a transistor 18 for allowing a current into said two transistors 19 and 20 in accordance with a current which is supplied to an input terminal IN of the transistor 18.

Second Preferred Embodiment

Now, a second preferred embodiment of the present invention will be described in the following, with reference to FIG. 7.

This embodiment replaces the magnetic resistance element 11 of said first preferred embodiment with other element.

Figure 7:
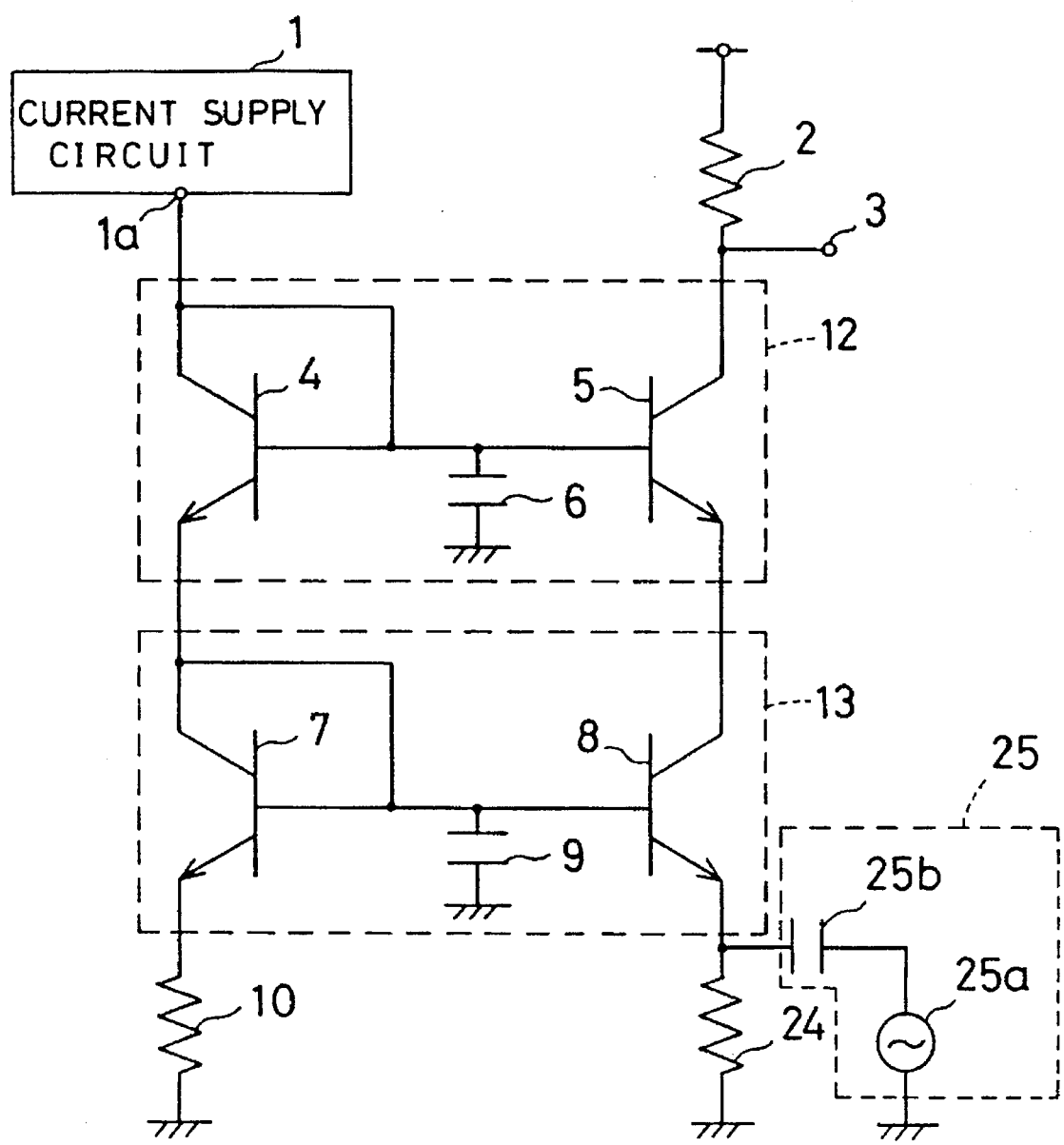
FIG. 7 is a view showing an amplifier circuit according to a second preferred embodiment of the present invention.

That is, in FIG. 7, one end of a resistor (i.e., third resistor) 24 is connected to the second output terminal $OUT_{f-2}$ of the first current mirror circuit 12, and the other end of the resistor 24 is grounded. An alternate current generation circuit 25 is connected between the second output terminal $OUT_{f-2}$ of the first current mirror circuit 12 and the one end of the resistor 24. The generation circuit 25 is formed by a signal source 25a and a capacitance 25b which cuts a direct current component from a signal which is outputted from the signal source 25a. The structure is otherwise the same as that of said first preferred embodiment, and therefore, analogous reference numerals are allotted to designate similar portions and a redundant description will be omitted.

Hence, in the amplifier circuit according to this embodiment, the signal source 25a outputs a voltage signal, the capacitance 25b cuts a direct current component from the output, and only an alternate current component is supplied to the resistor 24. This changes a current which flows in the resistor 24 and hence a current which flows in the second resistor 2, and therefore, a current which flows in the second resistor 2 changes. As a result, a voltage signal which is obtained by amplifying the voltage signal supplied from the signal source 25 is outputted outside at the output terminal 3.

Third Preferred Embodiment

Now, a third preferred embodiment of the present invention will be described in the following, with reference to FIGS. 8 and 9.

Denoted at 1 is the current supply circuit, denoted at 2 is the second resistor, denoted at 12 is the second current mirror circuit of said first preferred embodiment, denoted at 26, 27, 28 and 29 are input blocks each incorporating the second current mirror circuit, the first resistor and the magnetic resistance element of said first preferred embodiment. The input blocks have the same inner structure; that is, first and second input terminals 26a, 26b, 27a, 27b, 28a, 28b, 29a and 29b are connected in parallel to the first and the second output terminals $OUT_{s-1}$ and $OUT_{s-2}$ of said second current mirror circuit 13. The input blocks have select signal input terminals 26c, 27c, 28c and 29c for receiving a select signal which selects the respective input blocks.

In the second current mirror circuit 13, a resistor 30 for discharging and adjustment of the frequency characteristics is connected to the bases of the two transistors 4 and 5. This current mirror circuit 12 may be formed by the 3-transistor type current mirror circuit which is shown in FIG. 5.

Figure 9:
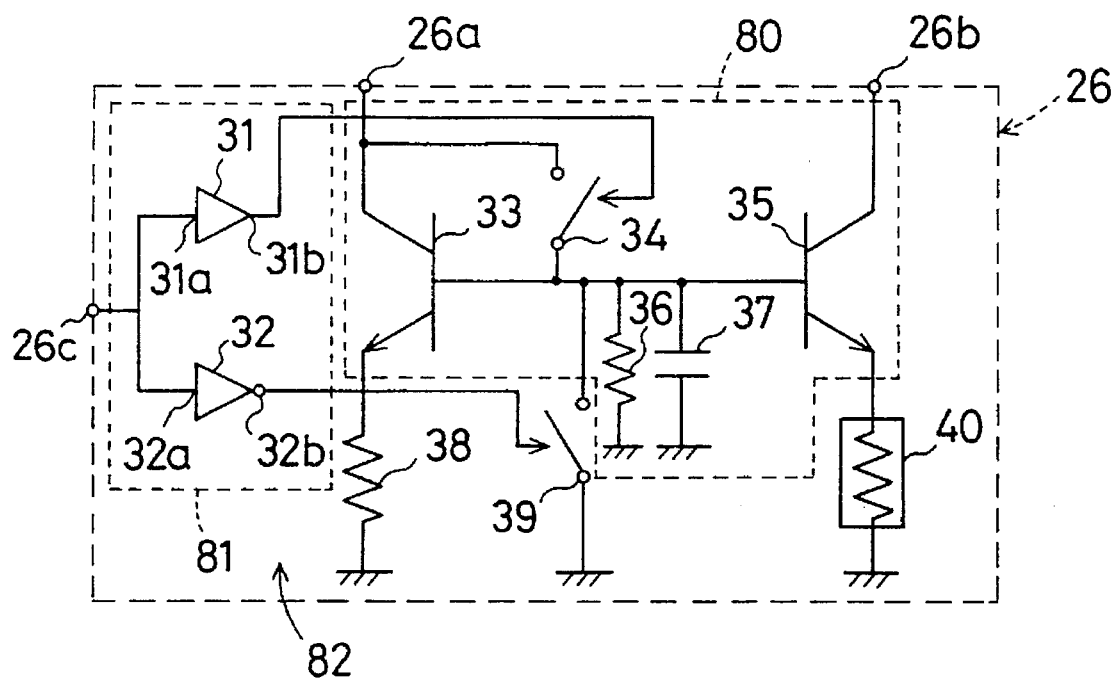
FIG. 9 is a view showing a specific structure of an input block within the amplifier circuit according to the third and the twelfth preferred embodiments of the present invention.

FIG. 9 shows an inner structure of one of the input blocks (e.g., 26). In FIG. 9, denoted at 81 is a first current mirror circuit which comprises two transistors 33 and 35, and a capacitance 37. Denoted at 38 is the first resistor, and denoted at 40 is the magnetic resistance element. The structure described so far is similar to that of the first current mirror circuit 12 which is shown in said first preferred embodiment. Now, a structure which is unique to this embodiment will be described below. Denoted at 36 is a resistor for discharging and adjustment of a high frequency characteristic, which is disposed between bases of said two transistors 33 and 35 and a ground. Denoted at 34 is a first switch circuit for connecting a collector and the base of said transistor 33. Denoted at 39 is a second switch circuit for grounding the base of the transistor 33. Denoted at 81 is a switch control circuit for controlling said two switch circuits. The two switch circuits 34, 39 and the first current mirror circuit 81 form a selection control circuit 82 for selecting the input block 26 which is formed in the selection control circuit 82.

In said first current mirror circuit 81, denoted at 31 is a buffer circuit. The select signal is supplied to an input terminal 31a of the buffer circuit 31 from said select signal input terminal 26c, and an output terminal 31b of the buffer circuit 31 is connected to said first switch circuit 34 to close the first switch circuit 34 when the select signal is received. Denoted at 32 is an inverter circuit. The select signal is supplied to an input terminal 32a of the inverter circuit 32 from said select signal input terminal 26c and is inverted. An inverted signal is outputted at an output terminal 32b of the inverter circuit 32 to the second switch circuit 39 to close the second switch circuit 39 when the select signal is not received.

Next, an operation of the amplifier circuit according to the present embodiment will be described. An example is cited in which the select signal is supplied to either one of the input blocks (e.g., 26) but the select signal is not supplied to the other input blocks 27, 28 and 29. In the input block 26, a control circuit 80 closes the first switch circuit 34 and opens the second switch circuit 39. Hence, with the collector and the base of the transistor 33 connected, the first current mirror circuit 80 functions as a current mirror circuit. As a result, a current is supplied to the magnetic resistance element 40. If the resistance value of the magnetic resistance element 40 changes due to an external factor under this condition, the value of a voltage which is developed across the magnetic resistance element 40 changes, and a voltage which is obtained by amplifying the voltage change is created across the second resistor 2 and outputted outside at the output terminal 3. On the other hand, in the other input blocks 27, 28 and 29, since switch circuits which correspond to the first switch circuit 34 open and switch circuits which correspond to the second switch circuit 39 close, bases of transistors which correspond to the transistor 33 are grounded, circuits which correspond to the first current mirror circuit 81 do not function as a current mirror circuit, a current is not supplied to elements which correspond to the magnetic resistance element 40, and therefore, a voltage is not generated across these elements.

Conversely, when the select signal is not supplied to any one of the input blocks, all input blocks stay in a non-selected condition so that a current does not flow in the magnetic resistance elements 40, and therefore, a voltage is not generated across the magnetic resistance elements 40.

Figure 3:
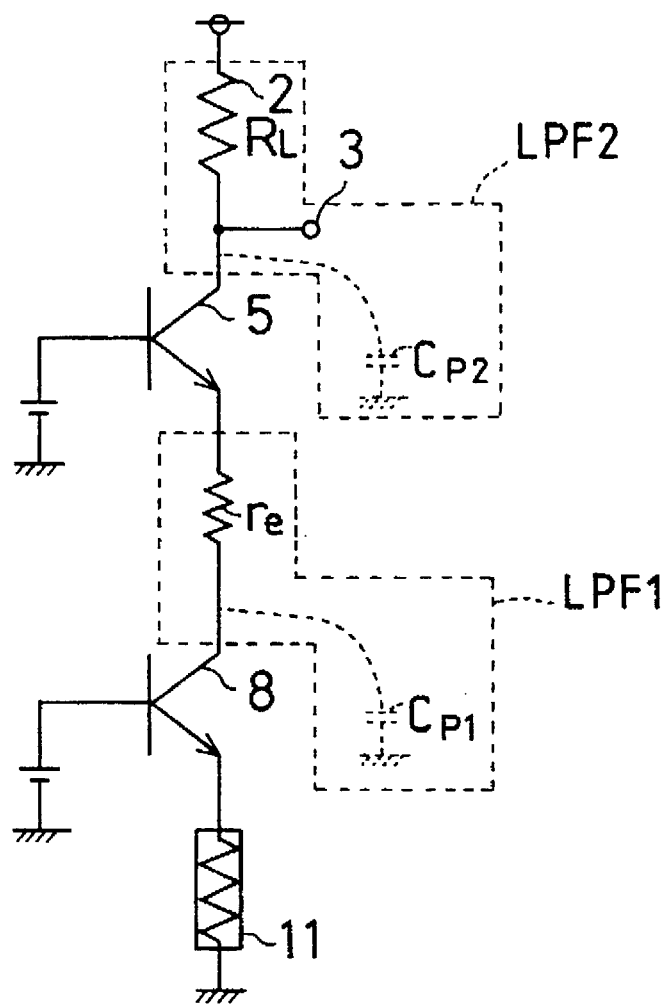
FIG. 3 is an explanatory diagram of a function of the amplifier circuit according to the first preferred embodiment of the present invention.

Thus, since the four input blocks 26 to 29 are connected in parallel in this embodiment, in the first low-pass filter LPF1 shown in FIG. 3, four parasitic capacitances Cp1 associated with the transistors 8 (which correspond to the transistor 35 shown in FIG. 9) are connected in parallel to create a total parasitic capacitance of 4·Cp1. Although the total parasitic capacitance of 4·Cp1 is extremely larger than the parasitic capacitance Cp2 which is created in the second low-pass filter LPF2, since the parasitic capacitance Cp2 does not change in the second low-pass filter LPF2 which is dominant in the high frequency region, it is possible to maintain a high gain in the high frequency region as well like in the amplifier circuit of FIG. 1 and to ensure an excellent high frequency characteristic.

Further, in the present embodiment, the second resistor 2, the transistor 5 of the current mirror circuit 12, the transistor 35 of the first current mirror circuit 80, and the magnetic resistance element 40 are connected in series in this order to the output terminal 3, and this series circuit does not include the first and the second switch circuits 34 and 39 which are disposed in the first current mirror circuit 80. Hence, when the magnetic resistance element 40 of either one of the input blocks is selected, that is, when said first and said second switch circuits 34 and 39 are alternately closed to make the first current mirror circuit 80 function as a current mirror circuit, or when a current which flows in the magnetic resistance element 40 of either one of the input blocks is controlled by stopping the first current mirror circuit 80 performing such a function, a voltage which is obtained by amplifying only a voltage change in the magnetic resistance element 40 can be obtained at the output terminal 3, without allowing resistance components and inductance components of the First and the second switch circuits 34 and 39 to affect a voltage which is developed across the magnetic resistance element 40. Therefore, it is possible to obtain an amplified output, without influenced by operations of the first and the second switch circuits 34 and 39.

Fourth Preferred Embodiment

Now, a fourth preferred embodiment of the present invention will be described in the following, with reference to FIG. 10.

Figure 10:
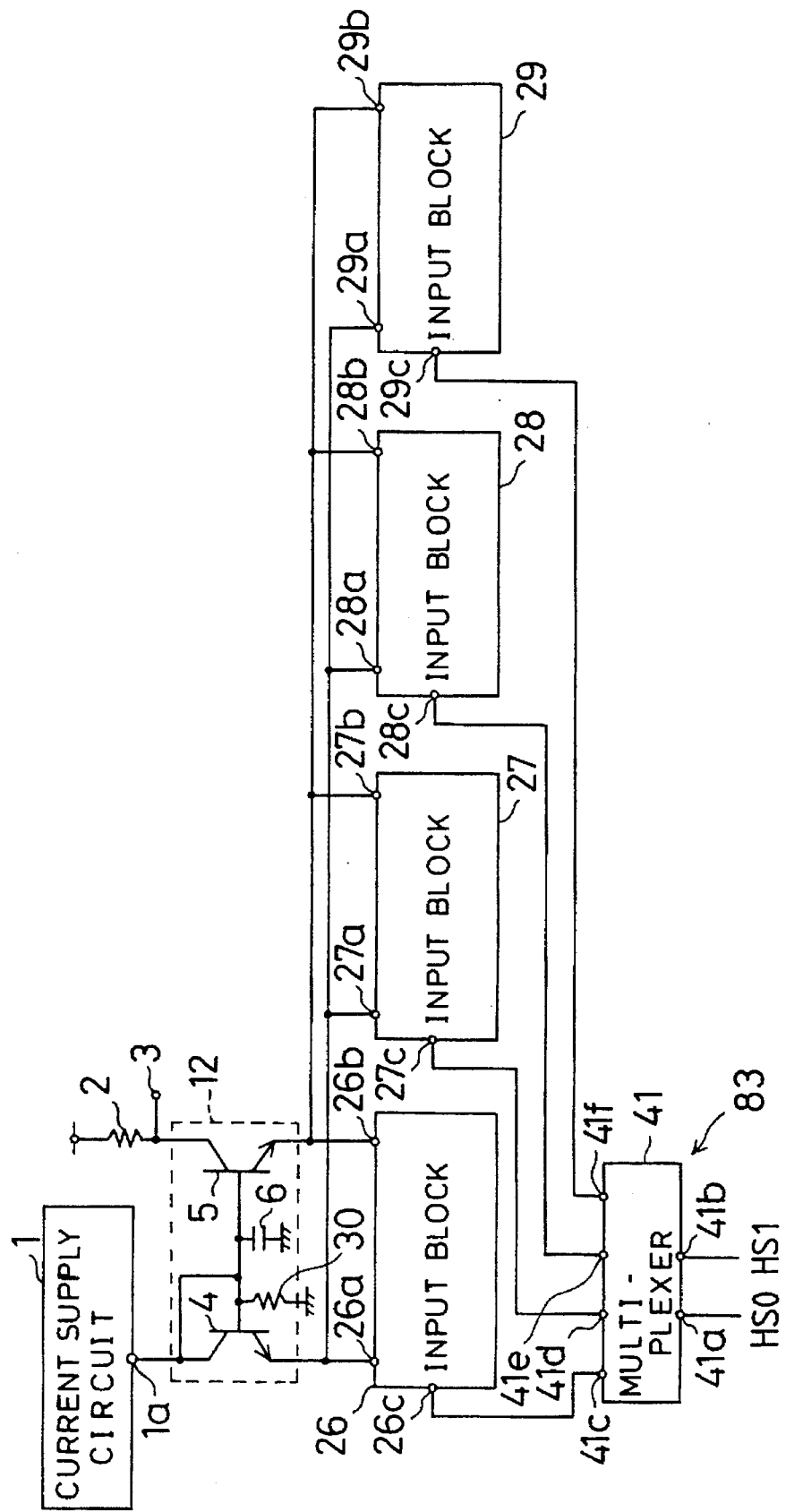
FIG. 10 is a view showing an amplifier circuit according to a fourth preferred embodiment of the present invention.

In FIG. 10, denoted at 41 is a multiplexer (i.e., select signal output circuit). Select instruction signals HS0, HS1 which are smaller in the number (i.e., two signals) than the input blocks (i.e., four blocks) are supplied to two input terminals 41a and 41b of the multiplexer 41, respectively. On the other hand, four output terminals 41c, 41d, 41e and 41f of the multiplexer 41 are connected to the input terminals 26c, 27c, 28c and 29c, respectively, of said four input blocks 26 to 29. The structure is otherwise the same as that of said third preferred embodiment which is shown in FIGS. 8 and 9, and therefore, analogous reference numerals are allotted to designate similar portions and a redundant description will be omitted.

Figure 11:
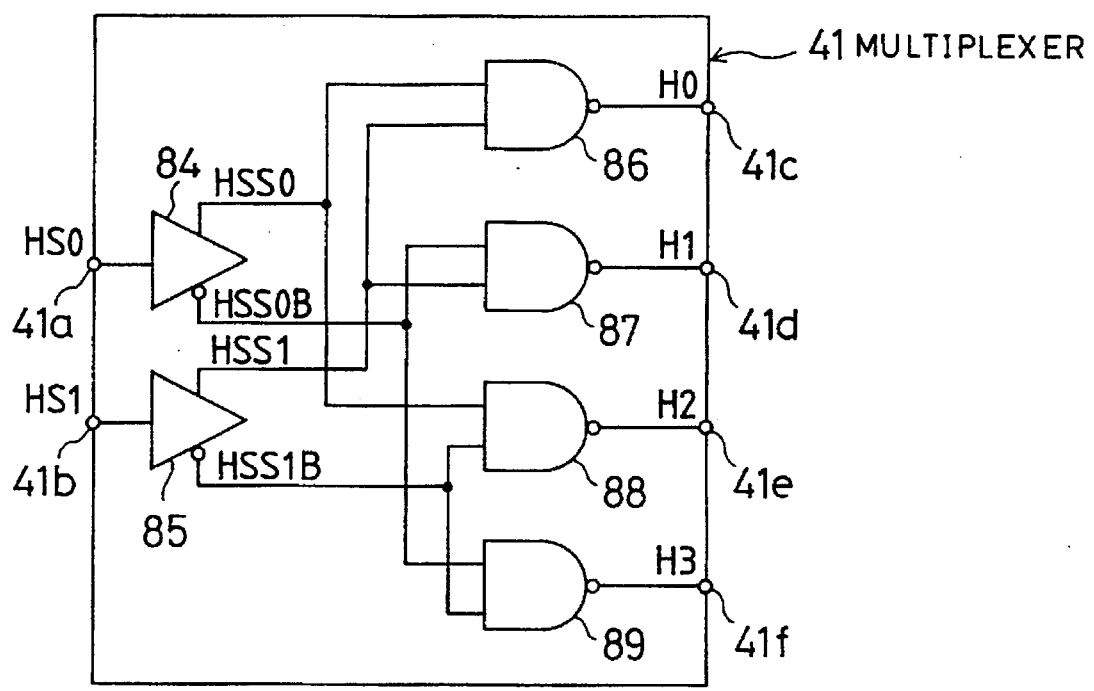
FIG. 11 is a view showing a specific structure of a multiplexer within the amplifier circuit according to the fourth preferred embodiment of the present invention.

FIG. 11 shows a specific structure of said multiplexer 41. The multiplexer 41 shown in FIG. 11 is formed by two differential circuits 84, 85 and four NAND circuits 86 to 89. The differential circuits 84 and 85 receive the select instruction signals HS0 and HS1 which are supplied to said input terminals 41a and 41b, respectively, output signals HSS0 and HSS1 which have the same logic as that of the select instruction signals, while outputting signals HSS0B and HSS1B which have inverted logic from that of said select instruction signals. Said NAND circuits 86 to 89 each output a signal of "H" level (select signal) when received two signals both having "L" level. As shown in a table of truth value in FIG. 12, this multiplexer 41 outputs a signal of "H" level (select signal) only at a predetermined one of the NAND circuits but outputs a signal of "L" level (non-select signal) from the other NAND circuits, in accordance with a combination of the two select instruction signals HS0 and HS1.

Said multiplexer 41 and the selection control circuits 82 of the input blocks 26 to 29 (See FIG. 9) form a selector circuit 83 for selecting either one of the input blocks.

Hence, in this embodiment, a few (i.e., two) select instruction signals are supplied to the multiplexer 41 and therefore either one of a number of (i.e., four) the input blocks 26 to 29 can be selected, which makes it easy to control selection of the input blocks.

Fifth Preferred Embodiment

Figure 13:
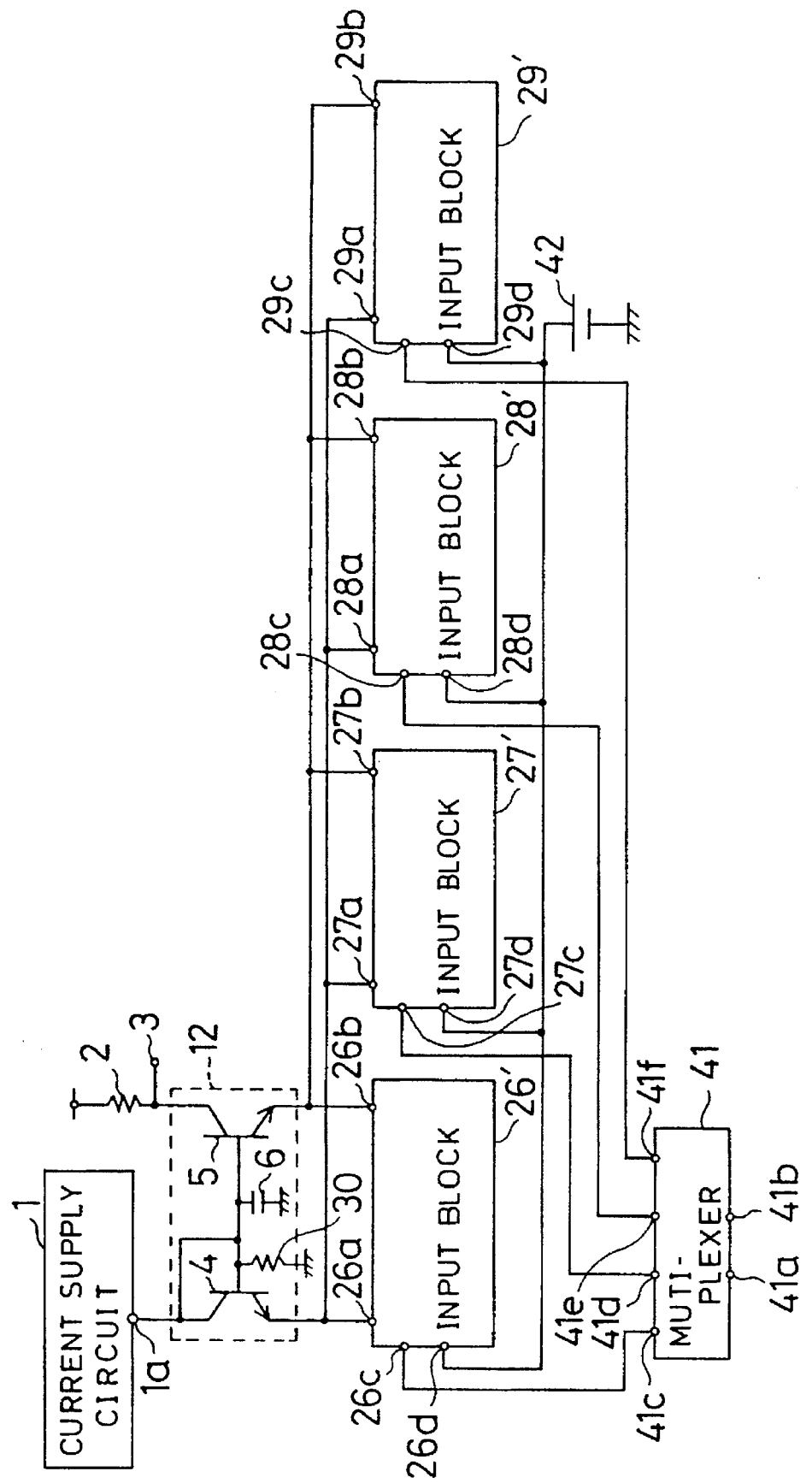
FIG. 13 is a view showing an amplifier circuit according to a fifth preferred embodiment of the present invention.
Figure 14:
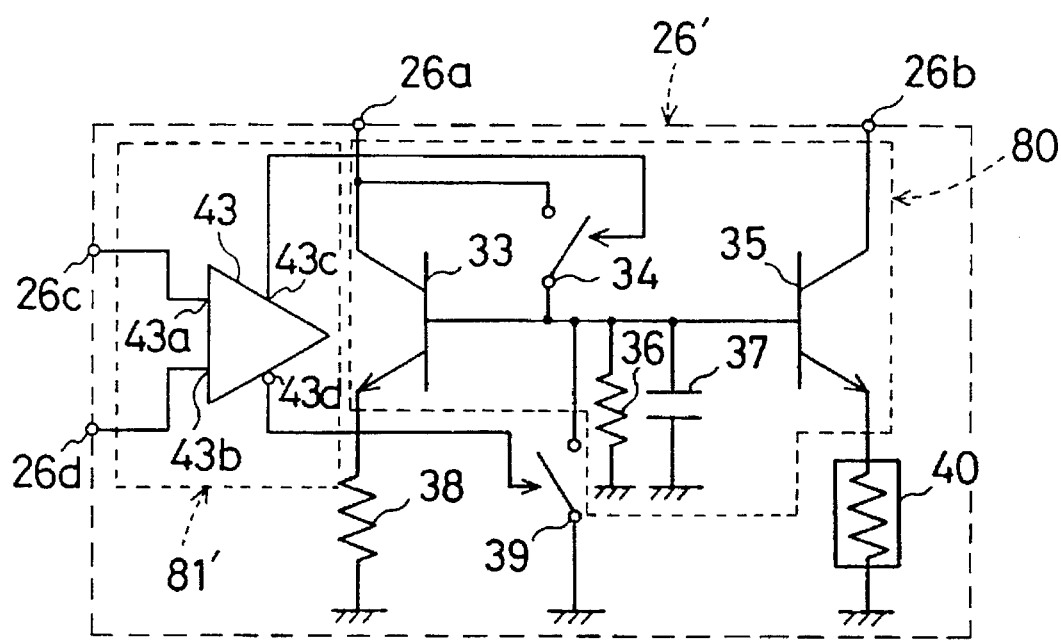
FIG. 14 is a view showing a specific structure of an input block within the amplifier circuit according to the fifth preferred embodiment of the present invention.

Now, a fifth preferred embodiment of the present invention will be described in the following, with reference to FIGS. 13 and 14.

The present embodiment is equivalent to the fourth preferred embodiment with the input blocks modified. That is, in FIG. 13, input blocks 26' to 29' further comprise second input terminals 26d, 27d, 28d and 29d, and one end of a voltage source 42 is connected to these input terminals. The other end of the voltage source 42 is set at a minimum potential (ground potential). A potential of the voltage source 42 is set at an intermediate potential between "H" level and "L" level of the select signal which is supplied to the input blocks 26' to 29'.

The respective input blocks have the same structure. FIG. 14 shows an inner structure of the input block 26'. The input block 26' shown in FIG. 14 is different from the input block 26 of the third preferred embodiment which is shown in FIG. 9, only regarding a first current mirror circuit 81'. Said first current mirror circuit 81' is formed by a differential circuit 43, the select signal and the non-select signal are supplied to a first input terminal 43a of the differential circuit 43 from the select signal input terminal 26c, and in order to receive the set voltage of the voltage source 42, said voltage source 42 is connected to a second input terminal 43b of the differential circuit 43 through the second input terminal 26d of the input block 26'. The differential circuit 43 amplifies a voltage difference between the select signal ("H" level) or the non-select signal ("L" level), which is supplied to the select signal input terminal 26c, and the set voltage, and thereafter outputs an amplified signal at a first output terminal 43c to the first switch circuit 34 while outputting an inverted signal of said amplified signal at a second output terminal 43d to the second switch circuit 39.

Hence, in the present embodiment, when the input block 26' is to be selected, for instance, the select signal ("H" level) is supplied to the input terminal 26c. Because of this, the differential circuit 43 of the control circuit 81' outputs a signal of "H" level at the first output terminal 43c, thereby closing the first switch circuit 34, while outputting a signal of "L" level at the second output terminal 43d, thereby opening the second switch circuit 39. As a result, the first current mirror circuit 80 of the input block 26' functions as a current mirror circuit, so that a voltage change at the magnetic resistance element 40 is amplified as a change in the voltage which is developed across said second resistor 2 and outputted outside at the output terminal 3. On the other hand, in the other input blocks 27' to 29'. differential amplifiers which correspond to the differential circuit 43 operate in reverse from the above, whereby switch circuits which correspond to the first switch circuit 34 open and switch circuits which correspond to the second switch circuit 39 close, and therefore, these input blocks which are not selected do not function as a current mirror circuit.

Since the differential circuit 43 switches the first and the second switch circuits 34 and 39 of each input block in the present embodiment, the control circuit 81' has a simpler structure than that of the control circuit 81 of said fourth preferred embodiment.

Sixth Preferred Embodiment

Now, a sixth preferred embodiment of the present invention will be described in the following, with reference to FIG. 15.

Figure 15:
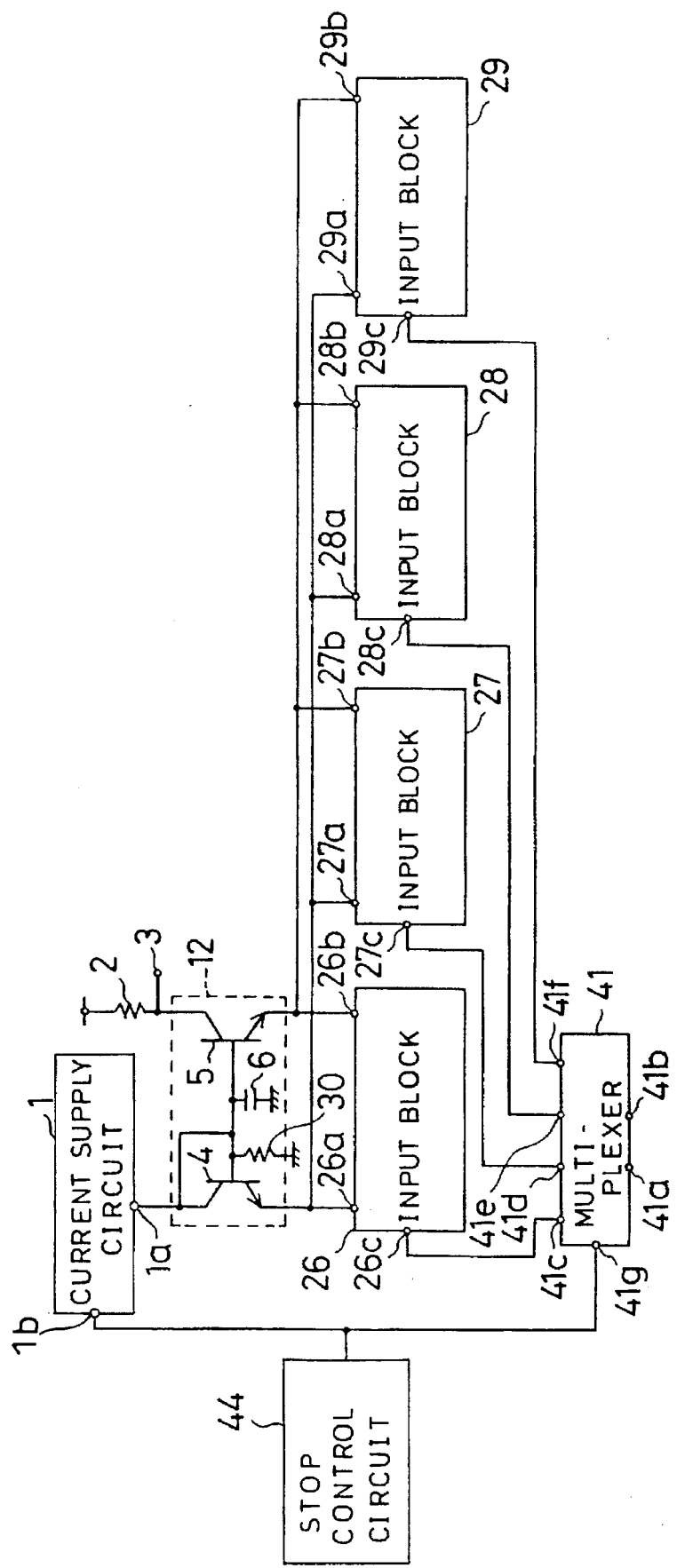
FIG. 15 is a view showing an amplifier circuit according to a sixth preferred embodiment of the present invention.

In FIG. 15, a signal input terminal 1b is formed in the current supply circuit 1. A signal input terminal 41g is formed in the multiplexer 41. Denoted 44 is a stop control circuit which instructs to stop supplying a current from said current supply circuit 1, and a stop control signal outputted from said circuit 44 is supplied to the signal input terminal 1b of the current supply circuit 1. The stop control signal outputted from the stop control circuit 44 is also supplied to the signal input terminal 41g of the multiplexer 41. The structures of the input blocks 26 to 29 are the same as the structure which is shown in FIG. 9.

The current supply circuit 1 receives said stop control signal at the signal input terminal 1b and stops supplying a current. The multiplexer 41 receives said stop control signal at the signal input terminal 41g and stops outputting the select signal to all input blocks 26 to 29. The structure is otherwise the same as that of said fourth preferred embodiment which is shown in FIG. 10, and therefore, analogous reference numerals are allotted to designate similar portions and a redundant description will be omitted.

Hence, in the present embodiment, when the current supply circuit 1 stops supplying a current, all input blocks 26 to 29 become non-selected and therefore do not function as a current mirror circuit. At this stage, in the input blocks 26 to 29, the second switch circuit 39 shown in FIG. 9 is closed, grounding the base of the transistor 35, and an electric charge of the capacitance 37 which is connected to this base is discharged, and therefore, the transistor 35 of the first current mirror circuit 80 is turned off. Hence, even if an electric charge of the capacitance 6 formed in the second current mirror circuit 13 is discharged through the transistor 5, the electric charge does not flow into the first current mirror circuit 80. Hence, it is possible to prevent a current from flowing into the magnetic resistance element 40 while the current supply circuit 1 remains inoperable.

Moreover, where the first switch circuit 34 is formed by a bipolar transistor, although a control current into a base of the bipolar transistor for turning off the first switch circuit 34 flows into an emitter of the bipolar transistor, this current is discharged through the second switch circuit 39 as it is closed. Therefore, this current is prevented from flowing into the magnetic resistance element 40 through the transistor 35 of the first current mirror circuit 80.

Seventh Preferred Embodiment

Now, a seventh preferred embodiment of the present invention will be described in the following, with reference to FIG. 16.

Figure 8:
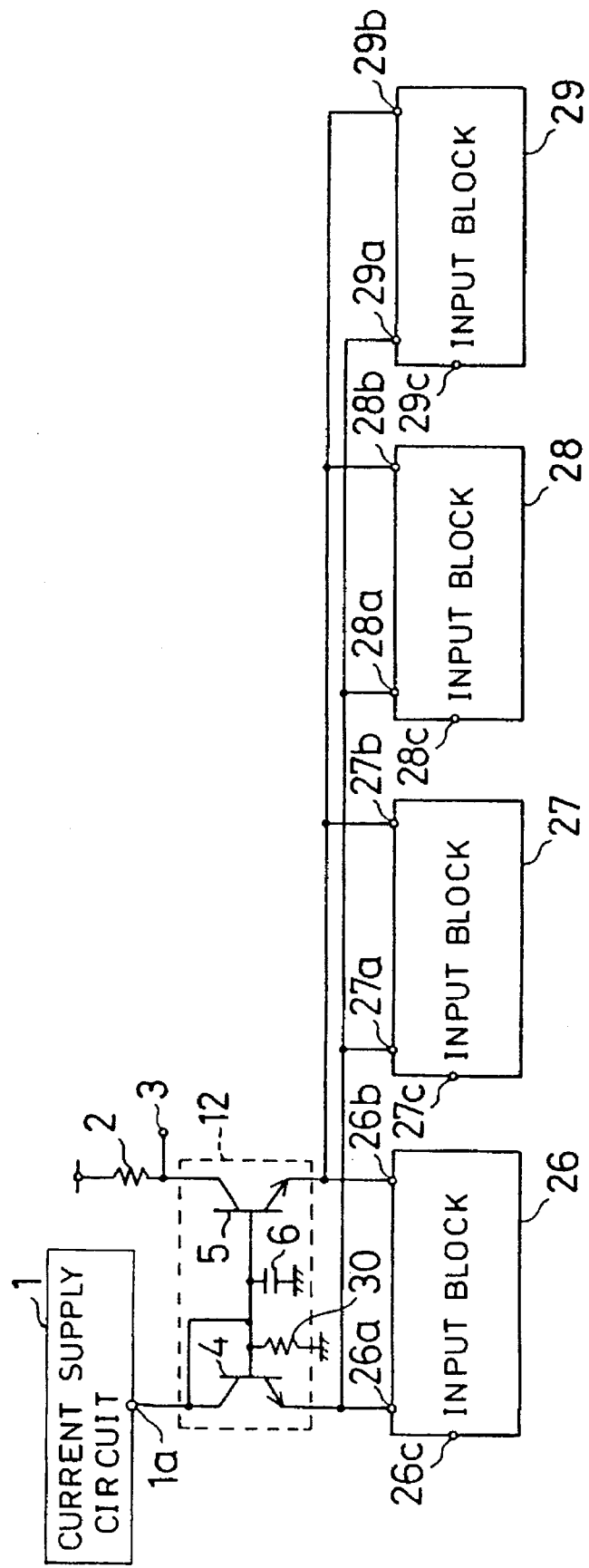
FIG. 8 is a view showing an amplifier circuit according to a third and a twelfth preferred embodiments of the present invention.

This embodiment is equivalent to the amplifier circuit according to said third preferred embodiment which is shown in FIG. 8, as it is modified to further comprise a voltage generation circuit.

Figure 16:
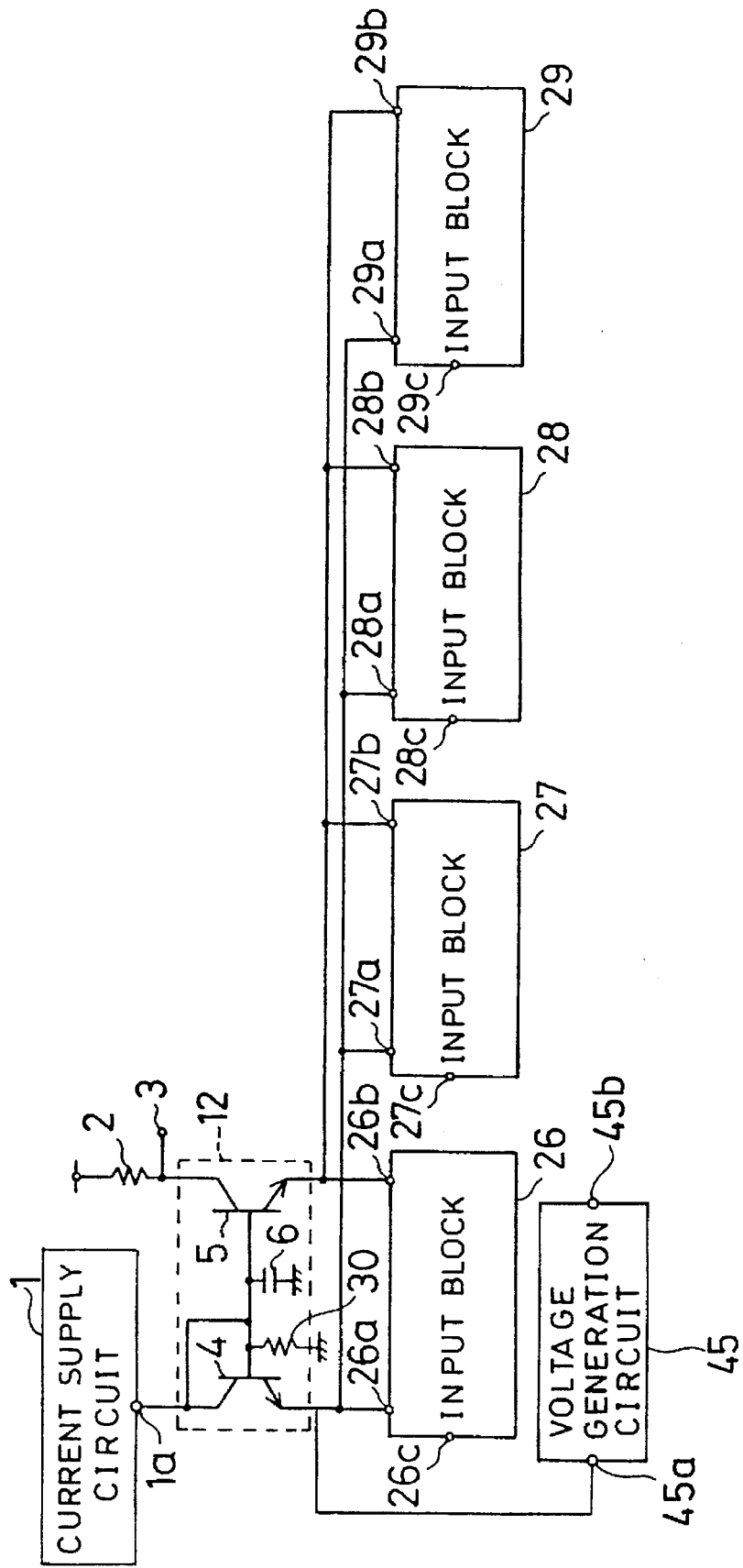
FIG. 16 is a view showing an amplifier circuit according to a seventh preferred embodiment of the present invention.

In FIG. 16, denoted at 45 is a voltage generation circuit. An output terminal 45a of the voltage generation circuit 45 is connected to the first output terminal $OUT_{s-1}$ of the second current mirror circuit 13. At an input terminal 45b, the voltage generation circuit 45 receives the select signal from each one of the input blocks 26 to 29. While either one of the input blocks is selected, i.e., while the select signal is supplied to the input terminal 45b, the voltage generation circuit 45 keeps the output terminal 45a at a high impedance condition to prevent generation of a voltage at the output terminal 45a. When all input blocks remain non-selected, the voltage generation circuit 45 generates a predetermined voltage at the output terminal 45a. The predetermined voltage is the same as a voltage which is developed at the emitter of the transistor 4 of the second current mirror circuit 13 while either one of the input blocks is selected.

Hence, in the present embodiment, even when all input blocks remain non-selected, the capacitance 6 formed in the second current mirror circuit 13 is charged up in advance by the voltage generation circuit 45. Therefore, when either one of the input blocks is selected after this, it is not necessary to charge the capacitance 6. Rather, it is possible to reduce a time which is needed until the next input block is actually selected, by a charging time which is otherwise necessary.

Eighth Preferred Embodiment

Now, an eighth preferred embodiment of the present invention will be described in the following, with reference to FIG. 17.

The amplifier according to the present embodiment is equivalent to the structure according to the third preferred embodiment which is shown in FIG. 8, as it is modified to comprise the following structure. That is, In FIG. 17, denoted at 46 is a buffer for performing impedance conversion of an output signal which is outputted at the output terminal 3, denoted at 47 is a capacitance which cuts a direct current component from a signal which passed through the buffer 46 to thereby pass only an alternate current component, and denoted at 48 is an amplifier circuit which is disposed at the next stage to receive a signal which passed through said capacitance 47 at an input terminal 48a to amplify the input signal and to output the signal at an output terminal 48c.

Figure 18:
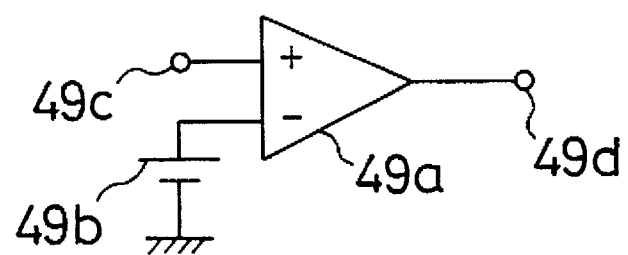
FIG. 18 is a view showing a specific structure of a voltage detection part within the amplifier circuit according to the eighth preferred embodiment of the present invention.

Further, denoted at 49 is a voltage detection part (i.e., voltage change detection circuit). As shown in FIG. 18, an inner structure of the voltage detection part 49 is formed by a comparator (comparison circuit) 49a and a reference voltage generation circuit 49b. Said reference voltage generation circuit 49b generates such a voltage which appears at the output terminal 3 when all input blocks 26 to 29 are in the non-selected condition, i.e., a reference voltage Vref (Vs Vref<Vo) which is between the voltage of the voltage source Vo (maximum voltage) and a voltage which appears at the output terminal 3 while any one of the input blocks is selected, namely, a voltage Vs which is calculated by subtracting a voltage drop at the second resistor 2 from the voltage of the voltage source Vo. In addition, the comparator 49a compares a voltage Vin which is supplied from the output terminal 3 to an output terminal 49c with said reference voltage Vref, and outputs a signal of "H" level at an output terminal 49d if Vin>Vref but outputs a signal of "L" level at the output terminal 49d if Vin≦Vref.

Figure 17:
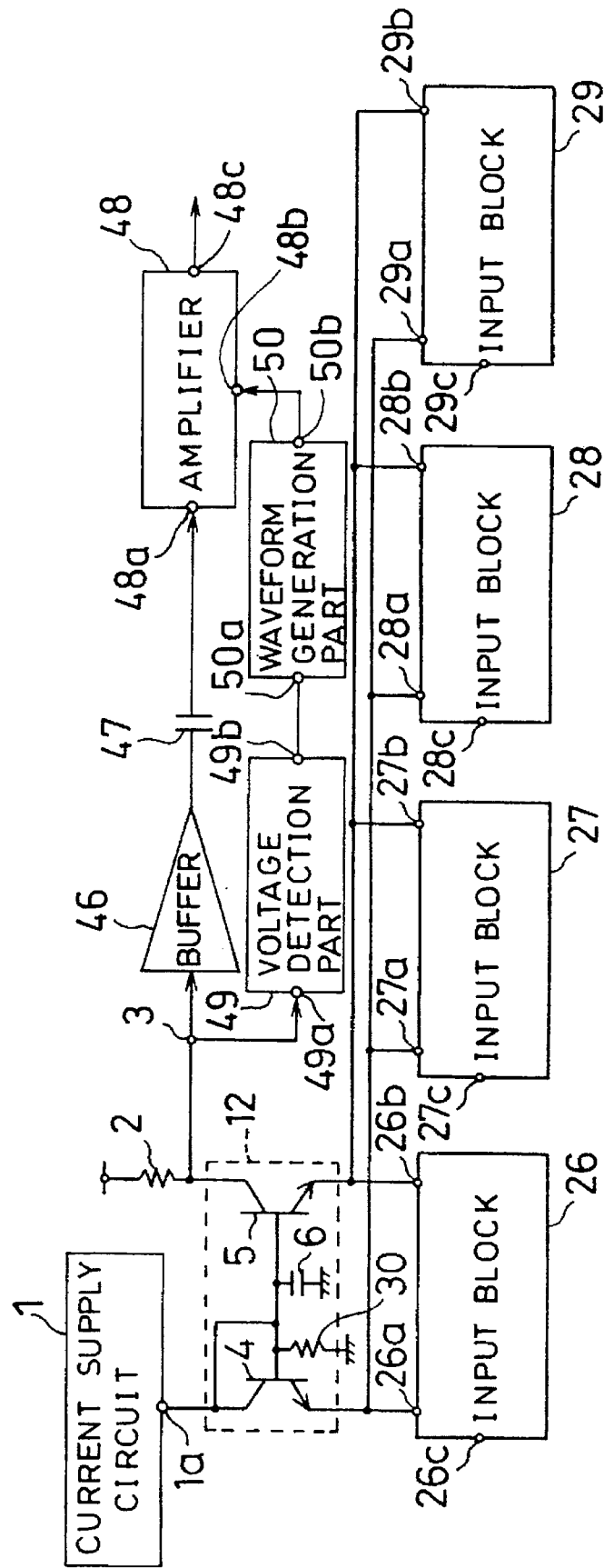
FIG. 17 is a view showing an amplifier circuit according to an eighth preferred embodiment of the present invention.

Further referring to FIG. 17, denoted at 50 is a waveform generation part which receives an output signal from said voltage detection part 49 at an input terminal 50a. When the potential level of the output signal from said voltage detection part 49 changes from "H" to "L" or "L" to "H," that is, when the voltage which appears at the output terminal 3 of the amplifier circuit decreases from the maximum voltage to a certain voltage or increases from a certain voltage to the maximum voltage, in other words, immediately after the first and the second current mirror circuits 12 and 80 function as a current mirror circuit and stop functioning as such, the waveform generation part 50 generates a one-shot signal at an output terminal 50b, and supplies this signal to a second input terminal 48b of said amplifier 48 which is disposed at the next stage. During inputting of the one-shot signal, the next stage amplifier 48 reduces an input impedance of the input terminal 48b to rapidly charge up or discharge the capacitance 47.

Hence, it is possible to shift a DC bias across the capacitance 47 into a stable condition in a short period of time immediately after the first and the second current mirror circuits 12 and 80 function as a current mirror circuit and stop functioning as such in the present embodiment, the next stage amplifier 48 quickly outputs a proper output in accordance with an output which is outputted at the output terminal 3 of the amplifier circuit.

A change in a voltage which appears at the output terminal 3 of the amplifier circuit may be detected and a detection signal may be used as a control signal for the input blocks and other circuits. For instance, all input blocks 26 to 29 may be controlled in the non-selected condition immediately after a voltage which appears at the output terminal 3 increases to the maximum voltage.

Ninth Preferred Embodiment

Now, a ninth preferred embodiment of the present invention will be described in the following, with reference to FIG. 19.

Figure 19:
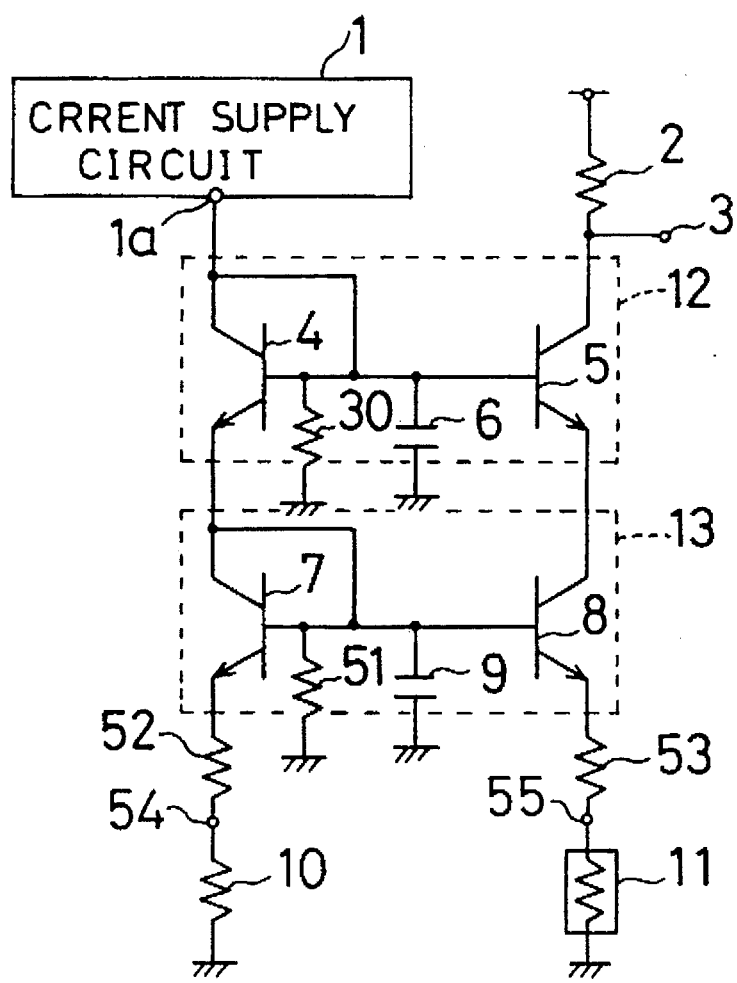
FIG. 19 is a view showing an amplifier circuit according to a ninth preferred embodiment of the present invention.

In FIG. 19, denoted at 52 is a fourth resistor, denoted at 53 is a fifth resistor, and denoted at 54 and 55 are external connection terminals of a semiconductor chip. The fourth resistor 52 has one end connected to the first output terminal $OUT_{f-1}$ of the first current mirror circuit 12, and the other end connected to the first resistor 10 through the external connection terminal 54. In a similar manner, the fifth resistor 53 has one end connected to the second output terminal $OUT_{f-2}$ of the first current mirror circuit 12, and the other end connected to the magnetic resistance element 11 through the external connection terminal 55. Hence, only the first resistor 10 and the magnetic resistance element 11 are disposed outside the semiconductor chip, and the other parts are disposed inside the semiconductor chip.

The resistor 52 and the external connection terminal 54 are connected to each other by a metal wire not shown. In a similar manner, the external connection terminal 54 and the first resistor 10 are connected to each other, the resistor 53 and the external connection terminal 55 are connected to each other, the external connection terminal 55 and the magnetic resistance element 11 are connected to each other, all by metal wires not shown.

A ratio of the resistance value of said fourth resistor 52 to the resistance value of said fifth resistor 53 is set equal to a ratio of the resistance value of the first resistor 10 to the resistance value of the magnetic resistance element 11.

Next, a current which flows in the magnetic resistance element 11 in the present embodiment will be described. The symbol ω expresses an angular velocity, the symbol L expresses a sum of a parasitic inductance of a metal wire which connects the resistor 53 and the external connection terminal 55 and a sum of a parasitic inductance of a metal wire which connects the external connection terminal 55 and the magnetic resistance element 11 the symbol ΔI expresses a change in a current which Flows in the magnetic resistance element 11, and the symbol Z expresses an impedance of said parasitic inductance L.

When there is no external factor to the magnetic resistance element 11, assuming that the two transistors 7 and 8 which form the current mirror circuit 13 have the same size, a current which flows in the magnetic resistance element 11 is determined by a ratio of a sum of the resistance values of the first resistor 10 and the resistor 52 to a sum of the resistance values of the magnetic resistance element 11 and the resistor 53 (i.e., mirror ratio n). When the resistance value of the magnetic resistance element 11 changes due to an external factor, a voltage which is applied across the magnetic resistance element 11 and a current which flows in the magnetic resistance element 11 and the resistor 53 change.

Since the impedance Z of the parasitic inductance L is expressed by the following relationship:

$$Z = j\omega L$$

assuming that the symbol ΔVL expresses a change in a voltage which is generated in the parasitic inductance L when the resistance value of said magnetic resistance element 11 changes due to an external factor, the change ΔVL is expressed as:

$$\Delta VL = Z \cdot \Delta I$$
$$= j\omega L \cdot \Delta I$$

Since a sum of said change ΔVL and a change $\Delta V_{MR}$ in a voltage developed across the magnetic resistance element 11 is outputted at the output terminal 3, when the angular speed ω is large, i.e., when a frequency is high, an output from the output terminal 3 is strongly influenced by the change ΔVL in the voltage which is generated in said parasitic inductance L. At this stage, the change ΔVL in the voltage which is generated in the parasitic inductance L changes so as to suppress a change ΔI in a current which flows in the magnetic resistance element 11.

Now, assuming that the symbol I0 expresses a current which flows in the magnetic resistance element 11 when the resistance value of the magnetic resistance element 11 does not change in the magnetic resistance element 11, the symbol I1 expresses a current which flows when the resistance value of the magnetic resistance element 11 changes due to an external factor, the symbol $R_{MR}$ expresses the resistance value of the magnetic resistance element 11, and the symbol $\Delta V_{MR}$ expresses a change in the resistance value of the magnetic resistance element 11 changes due to an external factor, $$I1 = I0 \cdot R_{MR} / (R_{MR} + \Delta R_{MR})$$

Hence, the change ΔI in a current which flows in the magnetic resistance element 11 is expressed as:

$$\Delta I = I1 - I0$$
$$= I0 \cdot (1/(1 + \Delta R_{MR}/R_{MR}) - 1)$$

Further, assuming that the symbol ΔI' expresses a change in a current which flows in the magnetic resistance element 11 when the resistor 58 having the resistance R is connected in series to the magnetic resistance element 11, $$\Delta I' = I0 \cdot (1/(1 + \Delta R_{MR}/(R + R_{MR})) - 1)$$

Hence, $$\Delta I' < \Delta I$$

Thus, when the resistor 53 is connected in series to the magnetic resistance element 11, the change ΔI' in a current which flows in the magnetic resistance element 11 becomes smaller than where the resistor 53 is not connected as such, and Therefore, the change ΔVL in a voltage due to the parasitic inductance becomes smaller. Hence, it is possible to suppress an influence of the change ΔVL over an output from the output terminal 3. It is to be noted in particular that a frequency characteristic in a high frequency region is improved since the output is less susceptible to the parasitic inductance even when a frequency is high.

Although the voltage gain at the output terminal 3 decreases because of loading by the resistors 52 and 53, the decrease can be compensated by increasing the resistance value of the second resistor 2. Alternatively, the decrease in the voltage gain at the output terminal 3 may be compensated by the input blocks, the amplifier circuit which is disposed at the next stage to the output terminal 3, etc.

Tenth Preferred Embodiment

Now, a tenth preferred embodiment of the present invention will be described in the following, with reference to FIG. 20.

Figure 20:
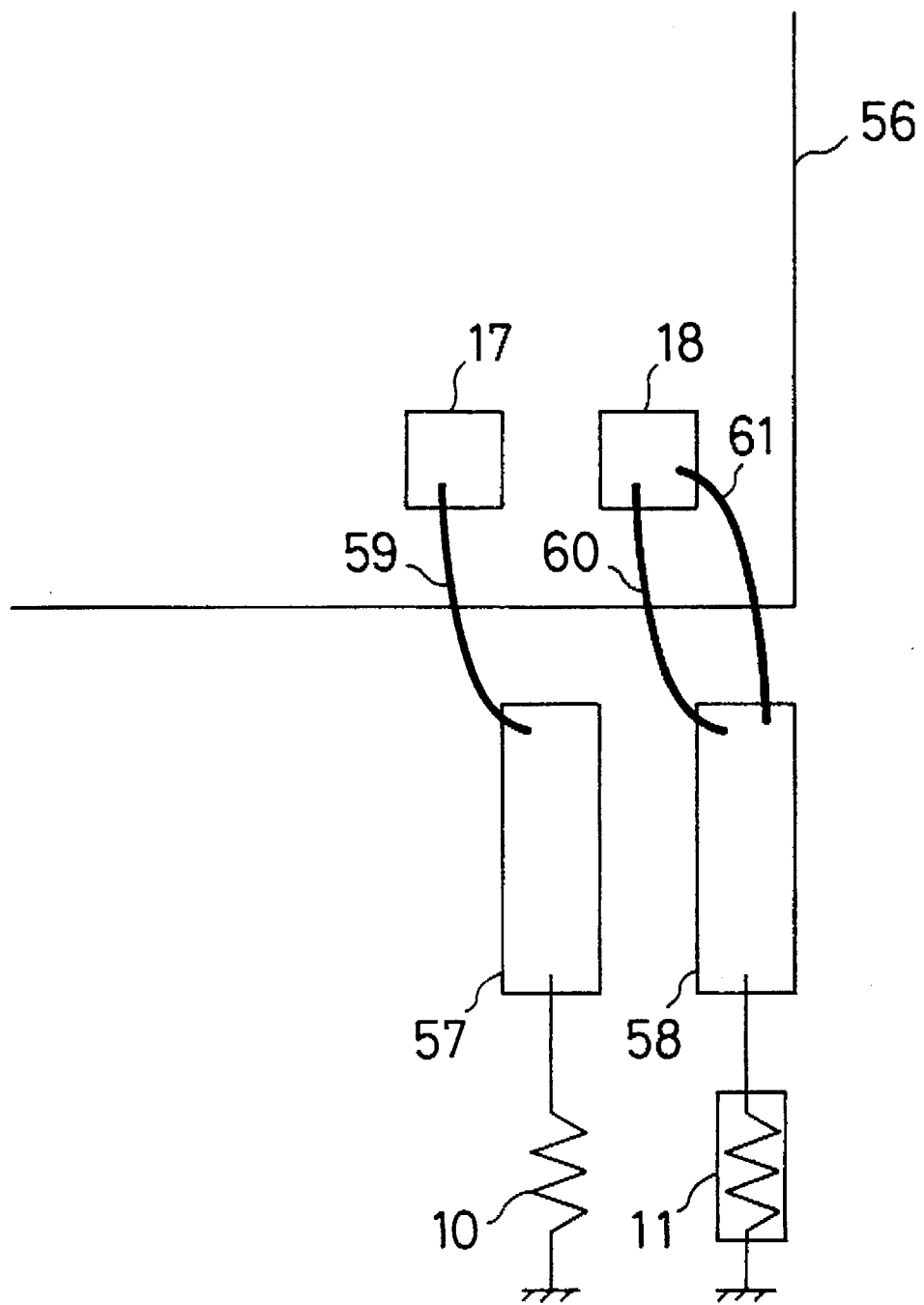
FIG. 20 is a view showing an essential structure of an amplifier circuit according to a tenth preferred embodiment of the present invention.

FIG. 20 shows details around the external connection terminals of the semiconductor chip of said ninth preferred embodiment. In FIG. 20, denoted at 56 is the semiconductor chip, denote at 17 is a first external connection terminal of said semiconductor chip 56, and denoted at 18 is a second external connection terminal of said semiconductor chip 56. The second external connection terminal 18 corresponds to the external connection terminals 54 and 55 which are shown in FIG. 19.

Said first external connection terminal 17 is connected to a lead frame 57 of the first resistor 10 which is disposed outside the semiconductor chip 56, by one bonding wire (first metal line) 59. Meanwhile, the second external connection terminal 18 is connected to a lead frame 58 of the magnetic resistance element 11 which is disposed outside the semiconductor chip 56, by two bonding wires (second metal lines) 60 and 61. Although not shown, resistors which correspond to the resistors 52 and 53 which are shown in FIG. 19 are connected to the external connection terminals 17 and 18, respectively.

Hence, in this embodiment, since the second external connection terminal 18 and the lead frame 58 of the magnetic resistance element 11 are connected to each other by the two bonding wires 60 and 61, a parasitic inductance of the bonding wires as a whole decreases. Therefore, a high frequency characteristic is better than in the ninth preferred embodiment, by a quantity which corresponds to the decrease.

Although the foregoing has described that the number of the bonding wires which connect the second external connection terminal 18 and the lead frame 58 of the magnetic resistance element 11 is two, the number of the bonding wires may be larger than two. In addition, the first external connection terminal 17 may be connected to the lead frame 57 of the first resistor 10 by a plurality of bonding wires.

Eleventh Preferred Embodiment

Now, an eleventh preferred embodiment of the present invention will be described in the following.

Since the appearance of the amplifier circuit according to the present embodiment has the same structure as the amplifier circuit according to the first preferred embodiment shown in FIG. 1, a description will be given with reference to FIG. 1 in the following.

In FIG. 1, while maintaining the mirror ratio at the set value n, which is determined by the first and the second current mirror circuits 12 and 13, the first resistor 10 and the magnetic resistance element 11, constant, the two transistors 4 and 5 which form the second current mirror circuit 13 are formed to have a smaller size than the two transistors 7 and 8 which form the first current mirror circuit 12.

Figure 2:
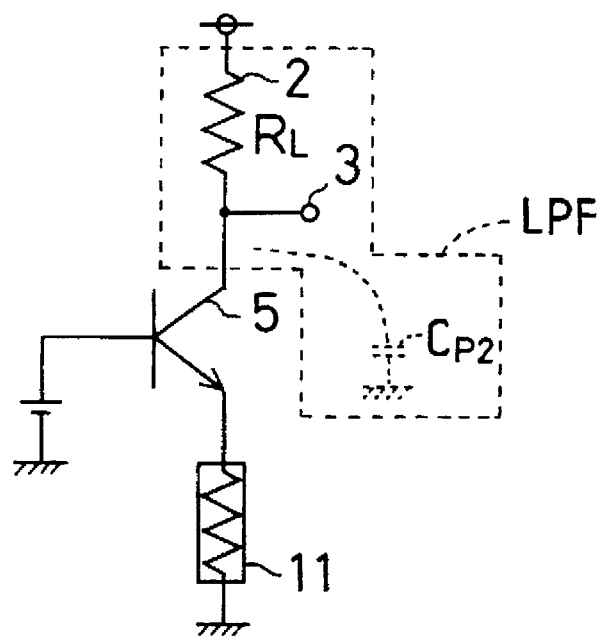
FIG. 2 is an explanatory diagram of a basic function of the amplifier circuit according to the first preferred embodiment of the present invention.

Hence, in this embodiment, the parasitic capacitance of the transistor 5 which forms the second current mirror circuit 13 is small, and the parasitic capacitance of the transistor 8 which forms the first current mirror circuit 12 is large. As a result, a high gain is maintained even in a higher frequency region than in the first preferred embodiment which is shown in FIG. 1, thereby further improving a high frequency characteristic. The reason will be now described with reference to FIGS. 2 and 3. FIG. 2 shows a 1-stage amplifier circuit of a base-grounded type. This circuit is equivalent to the circuit of FIG. 1 as it is modified to omit the first current mirror circuit 13 and the transistor 4 of the second current mirror circuit 12. FIG. 3 shows an amplifier circuit which is equivalent to the amplifier circuit of FIG. 2 as it is modified to additionally comprise the first current mirror circuit 13 of FIG. 1 and to omit the first transistor 7 of the circuit 13. This amplifier circuit is formed by connecting two amplifier circuits of the base-grounded type in a cascode structure. In the amplifier circuit shown in FIG. 3, the input impedance of the base-grounded circuit which is formed by the transistor 5, i.e., the emitter resistance re of the transistor 5 and the parasitic capacitance Cp1 of the transistor 8 form the first low pass filter LPF1, while the resistance value RL of the second resistor 2 and the parasitic capacitance Cp2 of the transistor 5 form the second low pass filter LPF2. If the emitter current in the transistor 5 is set large, the emitter resistance re becomes smaller so that re<RL is satisfied. When this relationship is satisfied, the second low pass filter LPF2 dominantly influences the high frequency characteristic of the amplifier circuit shown in FIG. 3. In this case, a relationship Cp2<Cp1 is satisfied between the parasitic capacitance Cp1 of the first low pass filter LPF1 and the parasitic capacitance Cp2 of the second low pass filter LPF2. Since an influence of the low-pass filters LPF1 and LPF2, which exist as a parasitic circuit, upon a high frequency characteristic is reduced accordingly, it is possible to maintain a high gain in an even higher frequency region than in the first preferred embodiment shown in FIG. 1, and to improve the high frequency characteristic.

Twelfth Preferred Embodiment

Now, a twelfth preferred embodiment of the present invention will be described in the following.

Since the appearance of the amplifier circuit according to the present embodiment has the same structure as the amplifier circuit according to the third preferred embodiment shown in FIGS. 8 and 9, a description will be given with reference to FIGS. 8 and 9 in the following.

In FIG. 9, the capacitance value of the capacitance 37, which is connected to the bases of the both two transistors 33 and 35 which form the first current mirror circuit 80, is set smaller than the capacitance value of the capacitance 6 which is connected to the bases of the both two transistors 4 and 5 which form the second current mirror circuit 13 shown in FIG. 8.

Hence, in the present embodiment, the capacitance 37 is charged up faster when either one of the input blocks 26 to 29 is selected, than where said capacitance 37 has the same capacitance value as the capacitance 6 or a larger capacitance value. Therefore, it is possible to switch selecting from one input block to other input block in a short period of time. Further, since the capacitance 37 is small, it is possible to incorporate the capacitance 37 in the semiconductor chip, when the amplifier circuit is formed by a semiconductor element.

Thirteenth Preferred Embodiment

Now, a thirteenth preferred embodiment of the present invention will be described in the following with reference to FIG. 21.

The amplifier according to the present embodiment is equivalent to the structure according to the first preferred embodiment which is shown in FIG. 1, as it is partially modified and include the following structure.

Figure 21:
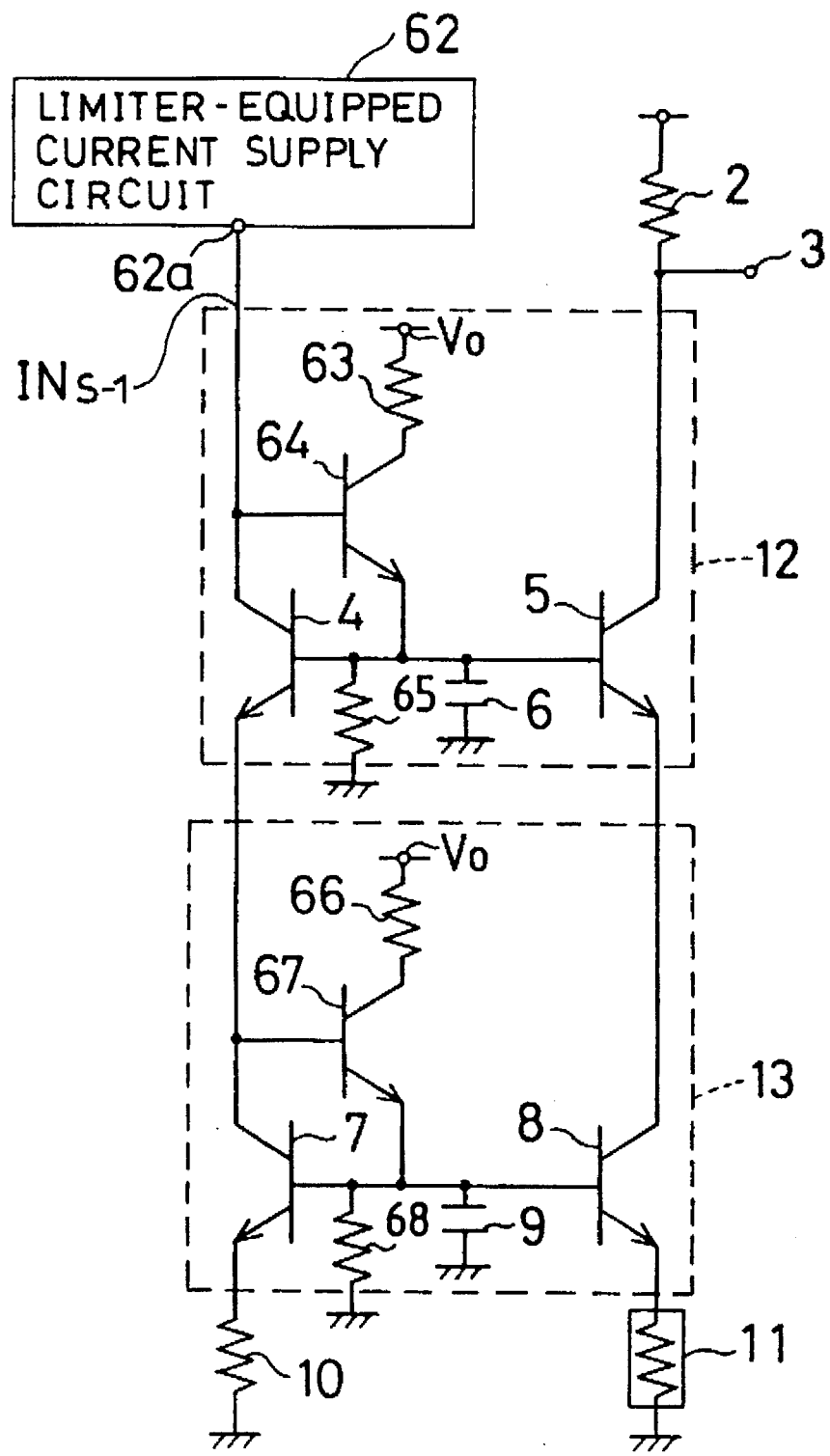
FIG. 21 is a view showing an amplifier circuit according to a thirteenth preferred embodiment of the present invention.

In FIG. 21, denoted at 62 is a current supply part with a limiter. A maximum current from an output terminal 62a of the current supply part 62 is restricted to a predetermined value. Arranged in the second current mirror circuit 13 are a transistor (i.e., limiter) 64 which restricts a current which flows into the bases of the both two transistors 4 and 5, a resistor (i.e., other limiter) 63 which restricts a current which flows into the transistor 64, and a resistor 65 which is located between the bases of the both two transistors 4 and 5 and a minimum potential (ground potential). Said transistor 64 has a collector connected to a maximum potential (power source) Vo through said resistor 63, and an emitter connected to the bases of the both two transistors 4 and 5, and a base connected to the first input terminal $IN_{s-1}$. In a similar manner, a current controlling transistor 67, a resistor 66 and other resistor 68 are arranged in the first current mirror circuit 12.

Hence, in the present embodiment, since the maximum value of a current which flows from output terminal 62a of the limiter-equipped current supply part 62 is restricted to the predetermined value and since currents which flow into the transistors 64 and 67 are restricted by the resistors 63 and 66, respectively, it is possible to restrict a current which flows into the magnetic resistance element 11, and to prevent deterioration or destruction of the magnetic resistance element 11 attributed to an excessive current without fall.

Fourteenth Preferred Embodiment

Figure 22:
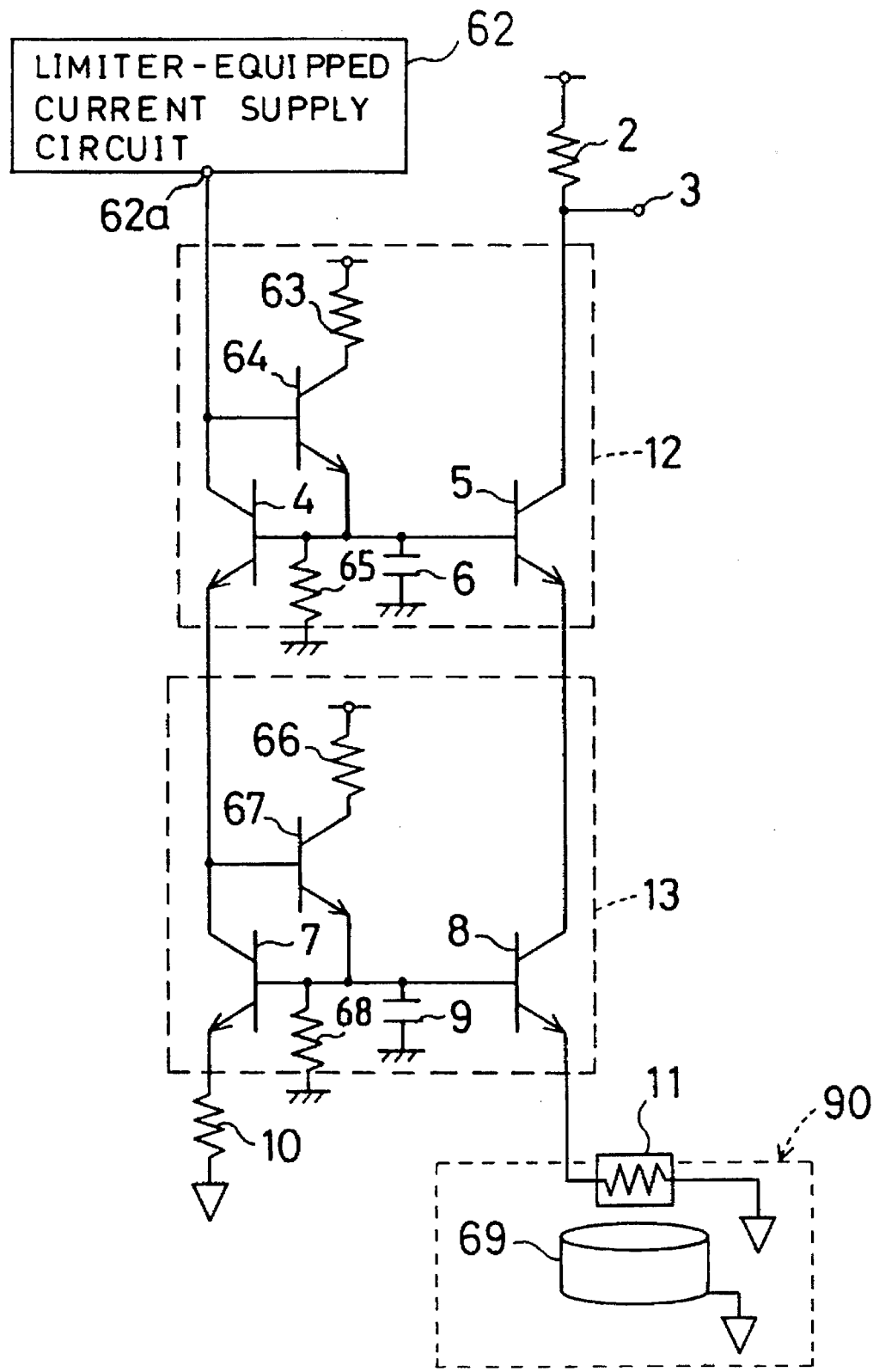
FIG. 22 is a view showing an amplifier circuit according to a fourteenth preferred embodiment of the present invention.

Now, a fourteenth preferred embodiment of the present invention will be described in the following with reference to FIG. 22.

The present embodiment is directed to an amplifier circuit which is suitable to a reading part of a magnetic recording apparatus, and is different from the thirteenth preferred embodiment which is shown in FIG. 21 regarding only the following point. That is, in FIG. 22, denoted at 90 is a magnetic recording apparatus and denoted at 69 is a magnetic recording medium which is mounted in the magnetic recording apparatus 90. The magnetic resistance element 11 functions as a head of a reading part of said magnetic recording apparatus 90. Said magnetic recording medium 69 is connected to a predetermined potential (which is denoted at the symbol ∇ in FIG. 22). The predetermined potential is a minimum potential, e.g., a ground potential to which the first resistor 10 and the magnetic resistance element 11 are connected.

Hence, in the present embodiment, when magnetic flux of the magnetic recording medium 69 changes, the resistance value of the head of the reading part (magnetic resistance element) accordingly changes in accordance with the change (i.e., external factor). The change in the resistance value is amplified as a voltage which is developed across the second resistor 2, and an amplified voltage is obtained at the output terminal 3.

Since the first resistor 10 and the head of the reading part of the magnetic recording apparatus (magnetic resistance element) 11 are connected at the same potential (i.e., ground potential) as the magnetic recording medium 69, even if the magnetic resistance element 11 contacts the magnetic recording medium 69, it is possible to prevent deterioration or destruction of the magnetic resistance element 11 because of a current which flows when such a contact is made.

Figure 23:
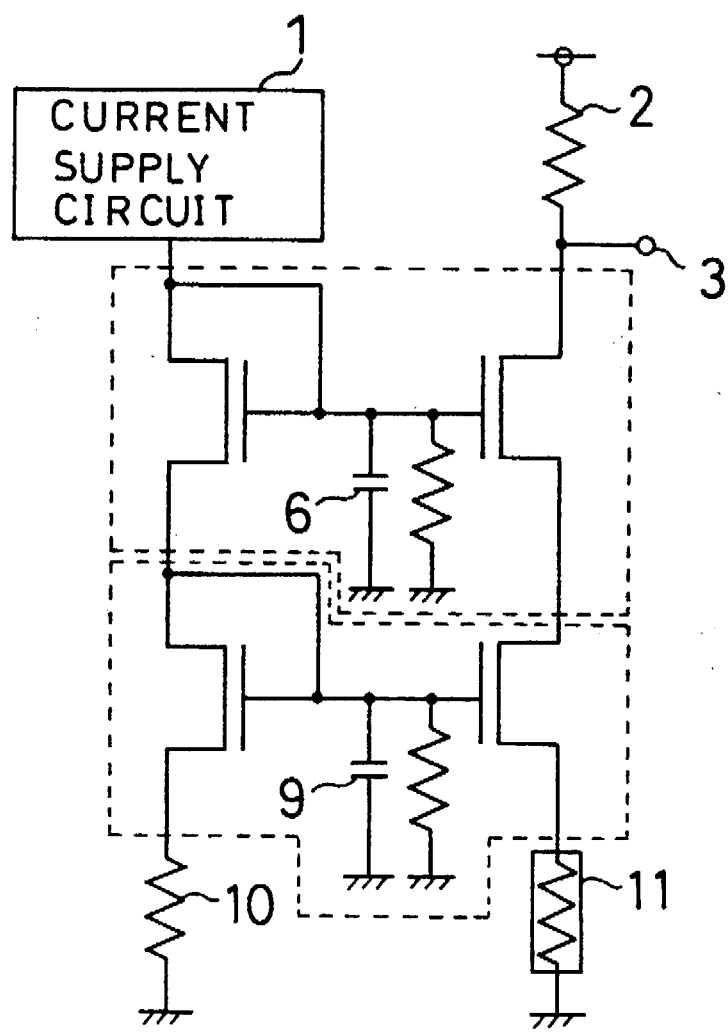
FIG. 23 is a view showing a structure in which a first current mirror circuit and a second current mirror circuit are formed by MOS transistors.

Although the first to the fourteenth preferred embodiments use bipolar transistors as the transistors which form the first and the second current mirror circuits, the present invention is not limited to such. Rather, MOS transistors may be used, of course. An amplifier circuit which is equivalent to FIG. 1 as it is modified to use MOS transistors is as shown in FIG. 23.

What is claimed is:

1. An amplifier circuit, comprising:

a first current mirror circuit and a second current mirror circuit;

a first resistor;

a resistor member whose resistance value changes due to an external factor;

a current supply circuit; and a second resistor, wherein said first and said second current mirror circuits have the same structure, said first and said second current mirror circuits each comprise: a first input terminal and a first output terminal; a first transistor which is coupled between the first input terminal and the first output terminal, said first transistor having a control electrode connected to said first input terminal; a second input terminal and a second output terminal; and a second transistor which is coupled between the second input terminal and the second output terminal, said second transistor having a control electrode connected to said first input terminal, said control electrodes of said first and said second transistors are connected to a set potential through a capacitance, the first and the second input terminals of said first current mirror circuit are connected to the first and the second output terminals of said second current mirror circuit, respectively, said first resistor is coupled between the first output terminal of said first current mirror circuit and a set constant potential, said resistor member is disposed between the second output terminal of said first current mirror circuit and said set constant potential, said current supply circuit is connected to the first input terminal of said second current mirror circuit, said second resistor is coupled between a power source and the second input terminal of said second current mirror circuit, and a change in the resistance value of said resistor member is outputted as a change in a voltage which is developed across said second resistor.

2. An amplifier circuit, comprising:

a first current mirror circuit and a second current mirror circuit;

a first resistor;

a current supply circuit;

a second resistor; a third resistor and an alternate current generation circuit, wherein said first and said second current mirror circuits have the same structure, said first and said second current mirror circuits each comprises: a first input terminal and a first output terminal; a first transistor which is coupled between the first input terminal and the first output terminal, said first transistor having a control electrode connected to said first input terminal; a second input terminal and a second output terminal; and a second transistor which is coupled between the second input terminal and the second output terminal, said second transistor having a control electrode connected to said first input terminal, said control electrodes of said first and said second transistors are connected to a set potential through a capacitance, the first and the second input terminals of said first current mirror circuit are connected to the first and the second output terminals of said second current mirror circuit, respectively, said first resistor is coupled between the first output terminal of said first current mirror circuit and a set constant potential, said third resistor is coupled between the second output terminal of said first current mirror circuit and said set constant potential, to receive an alternate current signal from said alternate current generation circuit, said current supply circuit is connected to the first input terminal of said second current mirror circuit, said second resistor is coupled between a power source and the second input terminal of said second current mirror circuit, and a change in the value of a current which is supplied to said third resistor from said second current mirror circuit is outputted as a change in a voltage which is developed across said second resistor.

3. An amplifier circuit, comprising:

a plurality of input blocks each consisting of a first current mirror circuit, a first resistor, a resistor member whose resistance value changes due to an external factor;

a selector circuit for selecting one of said plurality of input blocks;

a second current mirror circuit;

a current supply circuit; and a second resistor, wherein said first and said second current mirror circuits have the same structure, said first and said second current mirror circuits each comprises: a first input terminal and a first output terminal; a first transistor which is coupled between the first input terminal and the first output terminal, said first transistor having a control electrode connected to said first input terminal; a second input terminal and a second output terminal; and a second transistor which is coupled between the second input terminal and the second output terminal, said second transistor having a control electrode connected to said first input terminal, said control electrodes of said first and said second transistors are connected to a set potential through a capacitance, in each one of said input blocks:

the first and the second input terminals of said first current mirror circuit are connected to the first and the second input terminals of said second current mirror circuit, respectively;

said first resistor is coupled between the first output terminal of said first current mirror circuit and a set constant potential;

said resistor member is coupled between the second output terminal of said first current mirror circuit and said set constant potential, said current supply circuit is connected to the first input terminal of said second current mirror circuit, said second resistor is coupled between a power source and the second input terminal of said second current mirror circuit, and a change in the resistance value of said resistor member which belongs to one of the input blocks which is selected by said selector circuit is outputted as a change in a voltage which is developed across said second resistor.

4. The amplifier circuit of claim 3, wherein the selector circuit is formed by a select signal output circuit for outputting a select signal which selects one of the input block and a selection control circuit which is coupled in each one of the input block, said selection control circuit is formed by: a first switch circuit for shorting and opening the control electrode and the electrode which is connected to said first input terminal of the first transistor of an associated one of the input blocks; a second switch circuit for shorting and opening the control electrodes of said first and said second transistors and the set constant potential; and a switch control circuit for shorting said first switch circuit but opening said second switch circuit in response to the select signal from said select signal output circuit, said switch control circuit opening said first switch circuit but shorting said second switch circuit when the select signal is not received from said select signal output circuit.

5. The amplifier circuit of claim 4, wherein each switch control circuit is formed by:
- a buffer circuit for receiving the select signal from the select signal output circuit and for outputting a signal which has the same logic as that of the select signal to the first switch circuit; and
- an inverter circuit for receiving the select signal from said select signal output circuit, inverting the logic of the select signal, and for outputting an inverted signal to the second switch circuit.

6. The amplifier circuit of claim 4, wherein each switch control circuit comprises a differential amplifier circuit,
- said differential amplifier circuit has a first input terminal for receiving the select signal from the select signal output circuit, a second input terminal for receiving the set voltage, the differential amplifier circuit amplifies a voltage difference between the voltage of the inputted select signal and said set voltage by differential amplification, the differential amplifier circuit has a first output terminal at which, among the voltages which are amplified by differential amplification, the same logic as that of said inputted select signal appears, the differential amplifier circuit has a second output terminal at which, among the voltages which are amplified by differential amplification, opposite logic from that of said inputted select signal appears, and
- a voltage signal which appears at the first output terminal of said differential amplifier circuit is supplied to the first switch circuit, while a voltage signal which appears at said second output terminal is supplied to the second switch circuit.

7. The amplifier circuit of claim 4, wherein the select signal output circuit is formed by a differential circuit and an NAND circuit for receiving a fewer number of select instruction signals than the number of the input blocks from outside and for decoding these select instruction signals, and
- said NAND circuit outputs the select signal to either one of the input blocks but does not output the select signal to the other input blocks.

8. The amplifier circuit of claim 4, wherein a stop control circuit outputs a stop control signal to the select signal output circuit and the current supply circuit so as to stop supply of a current from the current supply circuit, and
- when the stop control signal is outputted from said stop control circuit, in response to the stop control signal, the select signal output circuit does not output the select signal to any one of the switch control circuits so as not to select any one of the input blocks.

9. The amplifier circuit of claim 1, 2, 3 or 4, wherein the sizes of the first and the second transistors which form the second current mirror circuit are set smaller than the sizes of the first and the second transistors which form the first current mirror circuit.

10. The amplifier circuit of claim 1, 2, 3 or 4, wherein the value of a capacitance which is created in the second current mirror circuit is set smaller than that of a capacitance which is created in the first current mirror circuit.

11. The amplifier circuit of claim 3 or 4, comprising a voltage generation circuit, wherein when either one of the input blocks is selected, said voltage generation circuit generates a voltage which has almost the same value as a voltage which is developed at the first output terminal of the second current mirror circuit, and supplies this voltage to the first output terminal of the second current mirror circuit when all input blocks are not selected by the select signal output circuit.

12. The amplifier circuit of claim 3 or 4, further comprising a voltage change detection circuit, wherein said voltage change detection circuit is formed by:
- a reference voltage generation circuit which generates a voltage which is equivalent to a voltage which is developed at the second output terminal of the second current mirror circuit when all input blocks are not selected; and
- a comparison circuit which receives the voltage which is generated by said reference voltage generation circuit and the voltage appearing at the second output terminal of said second current mirror circuit, and compares the two voltages, and
- the voltage change detection circuit detects a time at which the voltage appearing at the second output terminal of said second current mirror circuit coincides with the voltage which is generated by said reference voltage generation circuit, and also detects a time at which the two voltages cease to coincide with each other.

13. The amplifier circuit of claim 1, 2, 8 or 4, comprising:
- a fourth resistor which is coupled between the first output terminal of the first current mirror circuit and the first resistor; and
- a fifth resistor which is coupled between the second output terminal of said first current mirror circuit and the resistor member, and
- a ratio of the resistance value of said fourth resistor to the resistance value of said fifth resistor is set as a ratio of the resistance value of said first resistor to the resistance value of said resistor member.

14. The amplifier circuit of claim 13, wherein the first and the second current mirror circuits, the current supply circuit, the second resistor, the fourth resistor and the fifth resistor are disposed on the same semiconductor chip, and
- the first resistor and the resistor member are disposed outside the semiconductor chip.

15. The amplifier circuit of claim 14, wherein the semiconductor chip comprises a first external connection terminal which is connected to the fourth resistor and a second external connection terminal which is connected to the fifth resistor,
- one ends of the first resistor and the resistor member are each connected to a lead frame,
- said first external connection terminal and the lead frame for said first resistor are connected to each other by a first metal line, while said second external connection terminal and the lead frame for said resistor member are connected to each other by a second metal line, and
- at least one of said first and said metal lines is formed by a plurality of lines.

16. The amplifier circuit of claim 1, 2, 3 or 4, wherein the current supply circuit includes a limiter which restricts the maximum value of a supplied current to a predetermined value.

17. The amplifier circuit of claim 1, 2, 3 or 4, wherein the first and the second current mirror circuits include a limiter which restricts a current which flows in the resistor member.

18. The amplifier circuit of claim 1, 3 or 4, wherein the resistor member whose resistance value changes due to an external factor is a magnetic resistance element.

19. The amplifier circuit of claim 18, which is mounted in a magnetic recording apparatus which comprises a magnetic recording medium and a reading part which includes a head for reading data which are recorded in the recording medium, and the magnetic resistance element is used as the head of said reading part, a set constant potential which is supplied to one end of the magnetic resistance element is equal to a set constant potential which is supplied to one end of the magnetic recording medium.

* * * * *